US012684957B2

(12) United States Patent
Lee et al.

(10) Patent No.: US 12,684,957 B2
(45) Date of Patent: Jul. 14, 2026

(54) DISPLAY PANEL AND DISPLAY DEVICE

(71) Applicant: LG Display Co., Ltd., Seoul (KR)

(72) Inventors: KyungEon Lee, Suwon-si (KR);
Sungman Han, Goyang-si (KR)

(73) Assignee: LG Display Co., Ltd., Seoul (KR)

( * ) Notice: Subject to any disclaimer, the term of this
patent is extended or adjusted under 35
U.S.C. 154(b) by 441 days.

(21) Appl. No.: 18/480,877

(22) Filed: Oct. 4, 2023

(65) Prior Publication Data

US 2024/0224606 A1    Jul. 4, 2024

(30) Foreign Application Priority Data

Dec. 29, 2022    (KR) ........................ 10-2022-0189792

(51) Int. Cl.
H10K 59/122        (2023.01)
H10K 59/80        (2023.01)

(52) U.S. Cl.
CPC ..... H10K 59/122 (2023.02); H10K 59/80516
(2023.02)

(58) Field of Classification Search
CPC ........... H10K 59/122; H10K 59/80516; H10K
59/124; H10K 59/352; H10K 59/12;
H10K 59/80; H10K 59/173; H10K 59/35;
H10K 50/844; H10K 50/11; H10K 50/19;
H10K 50/813; H10K 50/82; H10K
2102/351
See application file for complete search history.

(56) References Cited

U.S. PATENT DOCUMENTS

| | | | |
|---|---|---|---|
| 2019/0189717 A1 | 6/2019 | Choi et al. | |
| 2020/0328376 A1 | 10/2020 | Seo et al. | |
| 2022/0208880 A1 | 6/2022 | Kim et al. | |
| 2024/0414953 A1* | 12/2024 | Fujimaki | H10K 59/8051 |

FOREIGN PATENT DOCUMENTS

| | | |
|---|---|---|
| KR | 20180013225 A | 2/2018 |
| KR | 20210082908 A | 7/2021 |
| KR | 20220076077 A | 6/2022 |
| KR | 20220088301 A | 6/2022 |

* cited by examiner

*Primary Examiner* — Anne M Hines
*Assistant Examiner* — Jose M Diaz
(74) *Attorney, Agent, or Firm* — Seed Intellectual
Property Law Group LLP

(57) ABSTRACT

A display panel and a display device configured to enhance
color gamut is provided. A display device includes an
auxiliary layer on at least one of the first to third anode
electrodes and extending to a portion of an upper surface of
an overcoat layer. The device includes a bank on the
auxiliary layer and the first to third anode electrodes and
including an opening exposing a portion of an upper surface
of each of the first to third anode electrodes. The device
includes a cathode electrode disposed on the organic layer.
The overcoat layer includes a stepped portion in an area
where the bank does not overlap at least one of the first to
third anode electrodes and the auxiliary layer and the upper
surface of the overcoat layer and a rear surface of the bank
are spaced apart from each other.

35 Claims, 27 Drawing Sheets

1

DISPLAY PANEL AND DISPLAY DEVICE

CROSS-REFERENCE TO RELATED APPLICATION

This application claims priority from Korean Patent Application No. 10-2022-0189792, filed on Dec. 29, 2022, which is hereby incorporated by reference for all purposes as if fully set forth herein.

BACKGROUND

Technical Field

Embodiments of the disclosure relate to a display panel and a display device.

Description of Related Art

A display device that implements various information as a screen is a key technology in the era of information and communication technology, and plays a role to display various information in a display area.

Display devices may require excellent display quality. In particular, since the feature of high color gamut is required along with implementation of low power, the importance is increasing.

BRIEF SUMMARY

Embodiments of the disclosure may provide a display panel and a display device capable of preventing a change in color coordinates due to emission of light from adjacent subpixels at a low gray level.

Embodiments of the disclosure may provide a display panel and a display device capable of low-power driving by preventing leakage of light from a non-emission area.

Embodiments of the disclosure may provide a display panel comprising a substrate, an overcoat layer disposed on the substrate, a first anode electrode, a second anode electrode, and a third anode electrode disposed on the overcoat layer and spaced apart from each other, an auxiliary layer disposed on a portion of an upper surface and a portion of a side surface of at least one of the first to third anode electrodes and extending to a portion of an upper surface of the overcoat layer, a bank disposed on the auxiliary layer and the first to third anode electrodes and including an opening exposing a portion of an upper surface of each of the first to third anode electrodes, a multi-layered organic layer disposed on the bank, and a cathode electrode disposed on the organic layer, wherein the overcoat layer includes a stepped portion in an area where the bank does not overlap at least one of the first to third anode electrodes and the auxiliary layer and the upper surface of the overcoat layer and a rear surface of the bank are spaced apart from each other.

Embodiments of the disclosure may provide a display device comprising a substrate, an overcoat layer disposed on the substrate, a first anode electrode, a second anode electrode, and a third anode electrode disposed on the overcoat layer and spaced apart from each other, an auxiliary layer disposed on a portion of an upper surface and a portion of a side surface of at least one of the first to third anode electrodes and extending to a portion of an upper surface of the overcoat layer, a bank disposed on the auxiliary layer and the first to third anode electrodes and including an opening exposing a portion of an upper surface of each of the first to third anode electrodes, a multi-layered organic layer disposed on the bank, and a cathode electrode disposed on the organic layer, wherein in a partial area of an area not overlapping the first to third anode electrodes is disposed an undercut structure constituted of the auxiliary layer, an area where the bank protrudes in one direction beyond where a side surface of the auxiliary layer contacting the upper surface of the overcoat layer is disposed, and the stepped portion of the overcoat layer, and wherein at least one layer of the multi-layered organic layer is broken in an area overlapping the undercut structure.

According to embodiments of the disclosure, there may be provided a display panel and a display device capable of preventing a change in color coordinates due to emission of light from an adjacent subpixel at a low gray level by disposing an undercut structure in a partial area of the non-emission area between emission areas which emit light of different colors to thereby break the organic layer of the light emitting element in the non-emission area.

According to embodiments of the disclosure, there may be provided a display panel and a display device capable of low-power driving by preventing leakage of light from a non-emission area.

BRIEF DESCRIPTION OF THE SEVERAL VIEWS OF THE DRAWINGS

The above and other objects, features, and advantages of the disclosure will be more clearly understood from the following detailed description, taken in conjunction with the accompanying drawings, in which.

DETAILED DESCRIPTION

Figure 1:
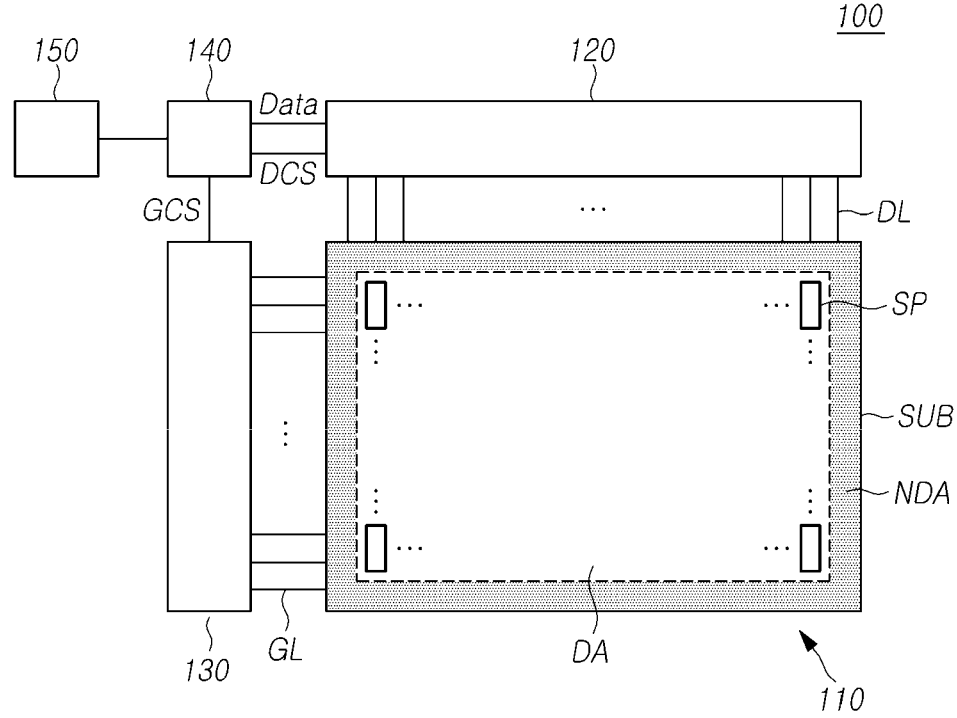
FIG. 1 is a view illustrating a system configuration of a display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap." etc., each other.

When time relative terms, such as "after," "subsequent to," "next." "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the disclosure are described in detail with reference to the accompanying drawings.

FIG. 1 is a view illustrating a system configuration of a display device 100 according to embodiments of the disclosure;

Referring to FIG. 1, a display device 100 according to embodiments of the disclosure may include a display panel 110 and driving circuits for driving the display panel 110.

The driving circuits may include a data driving circuit 120 and a gate driving circuit 130. The display device 100 may further include a controller 140 controlling the data driving circuit 120 and the gate driving circuit 130.

The display panel 110 may include a substrate SUB and signal lines, such as a plurality of data lines DL and a plurality of gate lines GL disposed on the substrate SUB. The display panel 110 may include a plurality of subpixels SP connected to the plurality of data lines DL and the plurality of gate lines GL.

The display panel 110 may include a display area DA in which images are displayed and a non-display area NDA which is positioned outside of the display area DA and where no image is displayed. In the display panel 110, a plurality of subpixels SP for displaying images may be disposed in the display area DA, and the driving circuits 120 and 130 may be electrically connected or disposed in the non-display area NDA. Further, pad units for connection of integrated circuits or a printed circuit may be disposed in the non-display area NDA.

The data driving circuit 120 is a circuit for driving the plurality of data lines DL, and may supply data signals to the plurality of data lines DL. The gate driving circuit 130 is a circuit for driving the plurality of gate lines GL, and may supply gate signals to the plurality of gate lines GL. The controller 140 may supply a data control signal DCS to the data driving circuit 120 to control the operation timing of the data driving circuit 120. The controller 140 may supply a gate control signal GCS for controlling the operation timing of the gate driving circuit 130 to the gate driving circuit 130.

The controller 140 may control to start scanning according to a timing implemented in each frame, convert input image data input from the outside into image data Data suited for the data signal format used in the data driving circuit 120, supply the image data Data to the data driving circuit 120, and control data driving to proceed at an appropriate time according to the scanning timing.

To control the gate driving circuit 130, the controller 140 may output various gate control signals GCS including a gate start pulse GSP, a gate shift clock GSC, and a gate output enable signal (Gate Output Enable, GOE).

To control the data driving circuit 120, the controller 140 may output various data control signals DCS including, e.g., a source start pulse SSP, a source sampling clock SSC, and a source output enable signal SOE.

The controller 140 may be implemented as a separate component from the data driving circuit 120, or the controller 140, along with the data driving circuit 120, may be implemented as an integrated circuit.

The data driving circuit 120 receives the image data Data from the controller 140 and supply data voltages to the plurality of data lines DL, thereby driving the plurality of data lines DL. The data driving circuit 120 is also referred to as a 'source driving circuit.'

The data driving circuit 120 may include one or more source driver integrated circuit (SDICs).

For example, each source driver integrated circuit (SDIC) may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may output a gate signal of a turn-on level voltage or a gate signal of a turn-off level voltage according to the control of the controller 140. The gate driving circuit 130 may sequentially drive the plurality of gate lines GL by sequentially supplying gate signals of the turn-on level voltage to the plurality of gate lines GL.

The gate driving circuit 130 may be connected with the display panel 110 by TAB method or connected to a bonding pad of the display panel 110 by a COG or COP method or may be connected with the display panel 110 according to a COF method. Alternatively, the gate driving circuit 130 may be formed in a gate in panel (GIP) type, in the non-display area NDA of the display panel 110. The gate driving circuit 130 may be disposed on the substrate SUB or may be connected to the substrate SUB. In other words, the gate driving circuit 130 that is of a GIP type may be disposed in the non-display area NDA of the substrate SUB. The gate driving circuit 130 that is of a chip-on-glass (COG) type or chip-on-film (COF) type may be connected to the substrate SUB.

Meanwhile, at least one of the data driving circuit 120 and the gate driving circuit 130 may be disposed in the display area DA. For example, at least one of the data driving circuit 120 and the gate driving circuit 130 may be disposed not to overlap the subpixels SP or to overlap all or some of the subpixels SP.

When a specific gate line GL is opened by the gate driving circuit 130, the data driving circuit 120 may convert the image data Data received from the controller 140 into an analog data voltage and supply it to the plurality of data lines DL.

The data driving circuit 120 may be connected to one side (e.g., an upper or lower side) of the display panel 110. Depending on the driving scheme or the panel design scheme, data driving circuits 120 may be connected with both the sides (e.g., both the upper and lower sides) of the display panel 110, or two or more of the four sides of the display panel 110.

The gate driving circuit 130 may be connected to one side (e.g., a left or right side) of the display panel 110. Depending on the driving scheme or the panel design scheme, gate driving circuits 130 may be connected with both the sides (e.g., both the left and right sides) of the display panel 110, or two or more of the four sides of the display panel 110.

The controller 140 may be a timing controller used in typical display technology, a control device that may perform other control functions as well as the functions of the timing controller, or a control device other than the timing controller, or may be a circuit in the control device. The controller 140 may be implemented as various circuits or electronic components, such as an integrated circuit (IC), a field programmable gate array (FPGA), an application specific integrated circuit (ASIC), or a processor.

The controller 140 may be mounted on a printed circuit board or a flexible printed circuit and may be electrically connected with the data driving circuit 120 and the gate driving circuit 130 through the printed circuit board or the flexible printed circuit.

The display device 100 according to embodiments of the disclosure may be a display including a backlight unit, such as a liquid crystal display, or may be a self-emission display, such as an organic light emitting diode (OLED) display, a quantum dot display, or a micro light emitting diode (LED) display.

If the display device 100 according to embodiments of the disclosure is an OLED display, each subpixel SP may include an organic light emitting diode (OLED), which by itself emits light, as the light emitting element. If the display device 100 according to embodiments of the disclosure is a quantum dot display, each subpixel SP may include a light emitting element formed of a quantum dot, which is a self-luminous semiconductor crystal. If the display device 100 according to embodiments of the disclosure is a micro LED display, each subpixel SP may include a micro LED, which is self-emissive and formed of an inorganic material, as the light emitting element.

Figure 2:
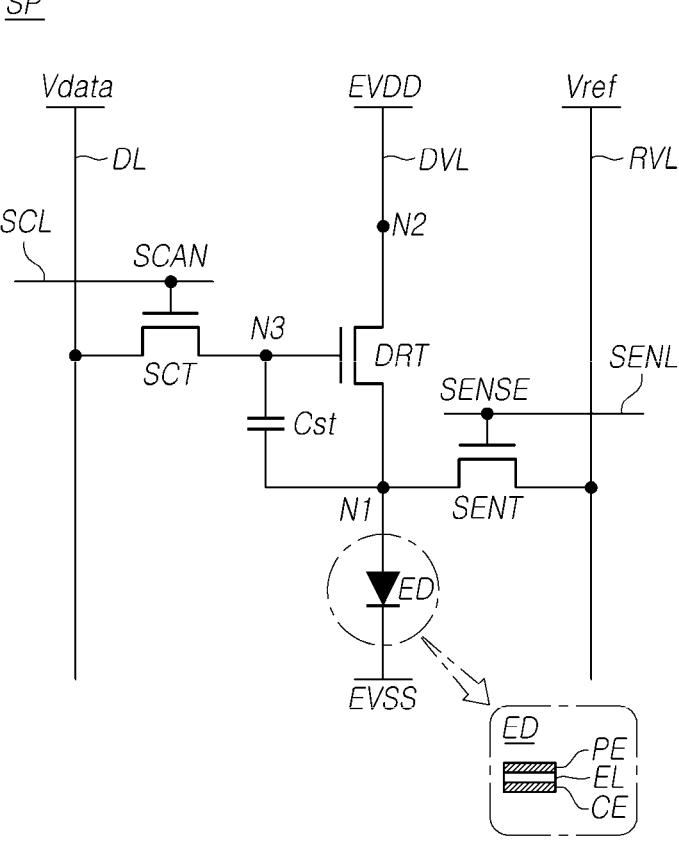
FIG. 2 is an equivalent circuit diagram illustrating a subpixel of a display device according to embodiments of the disclosure.

FIG. 2 is an equivalent circuit diagram illustrating a subpixel of a display device according to embodiments of the disclosure;

Referring to FIG. 2, each of a plurality of subpixels SP disposed on a display panel 110 of a display device 100 according to embodiments of the disclosure may include a light emitting element ED, a driving thin film transistor DRT, a scanning thin film transistor SCT, a sensing thin film transistor SENT, and a storage capacitor Cst.

Referring to FIG. 2, the light emitting element ED may include an anode electrode AE and a cathode electrode CE and may include a light emitting layer EL positioned between the anode electrode AE and the cathode electrode CE.

The anode electrode AE of the light emitting element ED may be an electrode disposed in each subpixel SP, and the cathode electrode CE may be an electrode commonly disposed in all the subpixels SP.

For example, the light emitting element ED may be an organic light emitting diode (OLED), a light emitting diode (LED), or a quantum dot light emitting element.

The driving thin film transistor DRT is a thin film transistor for driving the light emitting element ED, and may include a first node N1, a second node N2, and a third node N3.

The first node N1 of the driving thin film transistor DRT may be the source node (source electrode) or the drain node (drain electrode) of the driving thin film transistor DRT, and may be electrically connected to the pixel electrode PE of the light emitting element ED. The second node N2 of the driving thin film transistor DRT may be the drain node (drain electrode) or the source node (source electrode) of the driving thin film transistor DRT and be electrically connected to a driving voltage line DVL supplying the driving voltage EVDD. The third node N3 of the driving thin film transistor DRT may be the gate node (gate electrode) of the driving thin film transistor DRT and be electrically connected to the source node or the drain node of the scanning thin film transistor SCT.

The scanning thin film transistor SCT may be controlled by a scanning gate signal SCAN, which is a type of gate signal, and may be connected between the third node N3 of the driving thin film transistor DRT and the data line DL. In other words, the scanning thin film transistor SCT may be turned on or off according to the scanning gate signal SCAN supplied from the scanning gate line SCL, which is a type of the gate line GL, controlling the connection between the data line DL and the third node N3 of the driving thin film transistor DRT.

The scanning thin film transistor SCT may be turned on by the scanning gate signal SCAN having a turn-on level voltage and transfer the data voltage Vdata supplied from the data line DL to the third node N3 of the driving thin film transistor DRT.

If the scanning thin film transistor SCT is an n-type thin film transistor, the turn-on level voltage of the scanning gate signal SCAN may be a high level voltage. If the scanning thin film transistor SCT is a p-type thin film transistor, the turn-on level voltage of the scanning gate signal SCAN may be a low level voltage.

The sensing thin film transistor SENT may be controlled by a sensing gate signal SENSE, which is a type of gate signal, and may be connected between the first node N1 of the driving thin film transistor DRT and the reference voltage line RVL. In other words, the sensing thin film transistor SENT may be turned on or off according to the sensing gate signal SENSE supplied from the sensing gate line SENL, which is another type of the gate line GL, controlling the connection between the reference voltage line RVL and the first node N1 of the driving thin film transistor DRT.

The sensing thin film transistor SENT may be turned on by the sensing gate signal SENSE having a turn-on level voltage and transfer a reference voltage Vref supplied from the reference voltage line RVL to the first node N1 of the driving thin film transistor DRT.

The sensing thin film transistor SENT may be turned on by the sensing gate signal SENSE having a turn-on level voltage, transferring the voltage of the first node N1 of the driving thin film transistor DRT to the reference voltage line RVL.

If the sensing thin film transistor SENT is an n-type thin film transistor, the turn-on level voltage of the sensing gate signal SENSE may be a high level voltage. If the sensing thin film transistor SENT is a p-type thin film transistor, the turn-on level voltage of the sensing gate signal SENSE may be a low level voltage.

The function in which the sensing thin film transistor SENT transfers the voltage of the first node N1 of the driving thin film transistor DRT to the reference voltage line RVL may be used upon driving to sense the characteristic value of the subpixel SP. In this case, the voltage transferred to the reference voltage line RVL may be a voltage for calculating the characteristic value of the subpixel SP or a voltage reflecting the characteristic value of the subpixel SP.

Each of the driving thin film transistor DRT, the scanning thin film transistor SCT, and the sensing thin film transistor SENT may be an n-type thin film transistor or a p-type thin film transistor. In the disclosure, for convenience of description, each of the driving thin film transistor DRT, the scanning thin film transistor SCT, and the sensing thin film transistor SENT is an n-type thin film transistor.

The storage capacitor Cst is not a parasitic capacitor (e.g., Cgs or Cgd) which is an internal capacitor existing between the gate node and the source node (or drain node) of the driving thin film transistor DRT, but may be an external capacitor intentionally designed outside the driving thin film transistor DRT.

The scanning gate line SCL and the sensing gate line SENL may be different gate lines GL. In this case, the scanning gate signal SCAN and the sensing gate signal SENSE may be separate gate signals, and the on-off timings of the scanning thin film transistor SCT and the on-off timings of the sensing thin film transistor SENT in one subpixel SP may be independent. In other words, the on-off timings of the scanning thin film transistor SCT and the on-off timings of the sensing thin film transistor SENT in one subpixel SP may be the same or different.

Alternatively, the scanning gate line SCL and the sensing gate line SENL may be the same gate line GL. In other words, the gate node of the scanning thin film transistor SCT and the gate node of the sensing thin film transistor SENT in one subpixel SP may be connected with one gate line GL. In this case, the scanning gate signal SCAN and the sensing gate signal SENSE may be the same gate signals, and the on-off timings of the scanning thin film transistor SCT and the on-off timings of the sensing thin film transistor SENT in one subpixel SP may be the same.

The storage capacitor Cst may be electrically connected between the third node N3 and first node N1 of the driving thin film transistor DRT. The storage capacitor Cst is charged with the quantity of electric charge corresponding to the voltage difference between both ends thereof and serves to maintain the voltage difference between both ends for a predetermined frame time. Accordingly, during the predetermined frame time, the corresponding subpixel SP may emit light.

The structures of the subpixel SP shown in FIG. 2 are merely examples, and various changes may be made thereto, e.g., such as including one or more thin film transistors or one or more capacitors.

Figure 3:
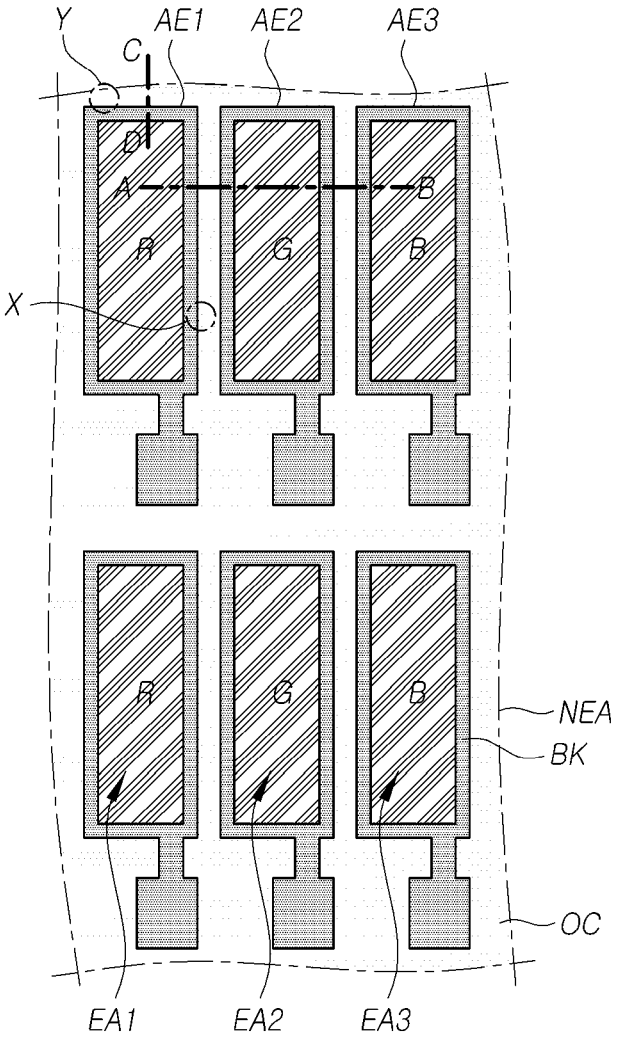
FIG. 3 is a plan view schematically illustrating a portion of a display area of a display device according to embodiments of the disclosure.

FIG. 3 is a plan view schematically illustrating a portion of a display area of a display device according to embodiments of the disclosure.

Referring to FIG. 3, the display area DA of the display panel 110 according to embodiments of the disclosure may include a plurality of emission areas EA1, EA2, and EA3 and a non-emission area NEA surrounding the plurality of emission areas EA1, EA2, and EA3.

A first emission area EA1 may be a red emission area, a second emission area EA2 may be a green emission area, and a third emission area EA3 may be a blue emission area, but the color and order of the emission area of the display panel 110 according to embodiments of the disclosure are not limited thereto.

Further, although not illustrated in FIG. 3, the display panel 110 according to embodiments of the disclosure may further include a plurality of fourth emission areas disposed in the display area DA, and the fourth emission area may be an emission area emitting white light.

Referring to FIG. 3, the display panel 110 may include a plurality of anode electrodes AE1, AE2, and AE3 overlapping the emission areas EA1, EA2, and EA3, respectively.

A bank BK exposing a portion of an upper surface of each of the plurality of anode electrodes AE1, AE2, and AE3 may be disposed on the plurality of anode electrodes AE1, AE2, and AE3. As illustrated in FIG. 3, the upper surface of each of the plurality of anode electrodes AE1, AE2, and AE3 may overlap an opening provided in the bank BK.

An overcoat layer OC may be disposed under the bank BK and the plurality of anode electrodes AE1, AE2, and AE3.

Referring to FIG. 3, an area where the bank BK is not disposed may be present in a portion of the non-emission area NEA present between different emission areas disposed adjacent to each other.

In other words, as illustrated in FIG. 3, the bank BK may be disposed only in some areas adjacent to edges of the plurality of anode electrodes AE1, AE2, and AE3 and edges of the plurality of anode electrodes AE1, AE2, and AE3.

Accordingly, in the non-emission area NEA, there may be an area where the bank BK exposes the upper surface of the overcoat layer OC.

For example, as illustrated in FIG. 3, there may be an area where the bank BK is not disposed in the non-emission area NEA between one first emission area EA1 and a second emission area EA2 disposed adjacent to the first emission area EA1.

Further, there may be an area where the bank BK is not disposed in the non-emission area NEA between one second emission area EA2 and the third emission area EA3 disposed adjacent to the second emission area EA2.

Further, there may be an area where the bank BK is not disposed in the non-emission area NEA between one third emission area EA3 and the first emission area EA1 disposed adjacent to the third emission area EA3.

Further, referring to FIG. 3, at least two emission areas emitting light of the same color may be disposed in the same column, and an area where the bank BK is not disposed may be also present in the non-emission area NEA between the emission areas disposed in the same column.

A plurality of organic layers including a light emitting layer may be disposed on a substrate on which the plurality of anode electrodes AE1, AE2, and AE3 are disposed, and the resistance of each organic layer may be different. In this case, a lateral leakage current may be generated due to a low-resistance layer. When a lateral leakage current is generated, light emission of the light emitting element may also occur in a non-emission area adjacent to the emission area. However, due to light emission of a color different from that of the emission area, color coordinates of the display panel 110 may be changed at a low gray level.

Accordingly, the display panel 110 according to embodiments of the disclosure may have a structure in which a portion of the organic layer is broken in the non-emission area NEA to prevent quality degradation of the display panel due to light emission of the light emitting element in the non-emission area NEA around the emission areas EA1, EA2, and EA3.

The structure of the display panel according to embodiments of the disclosure is described in detail with reference to FIGS. 4 to 7.

Figure 4:
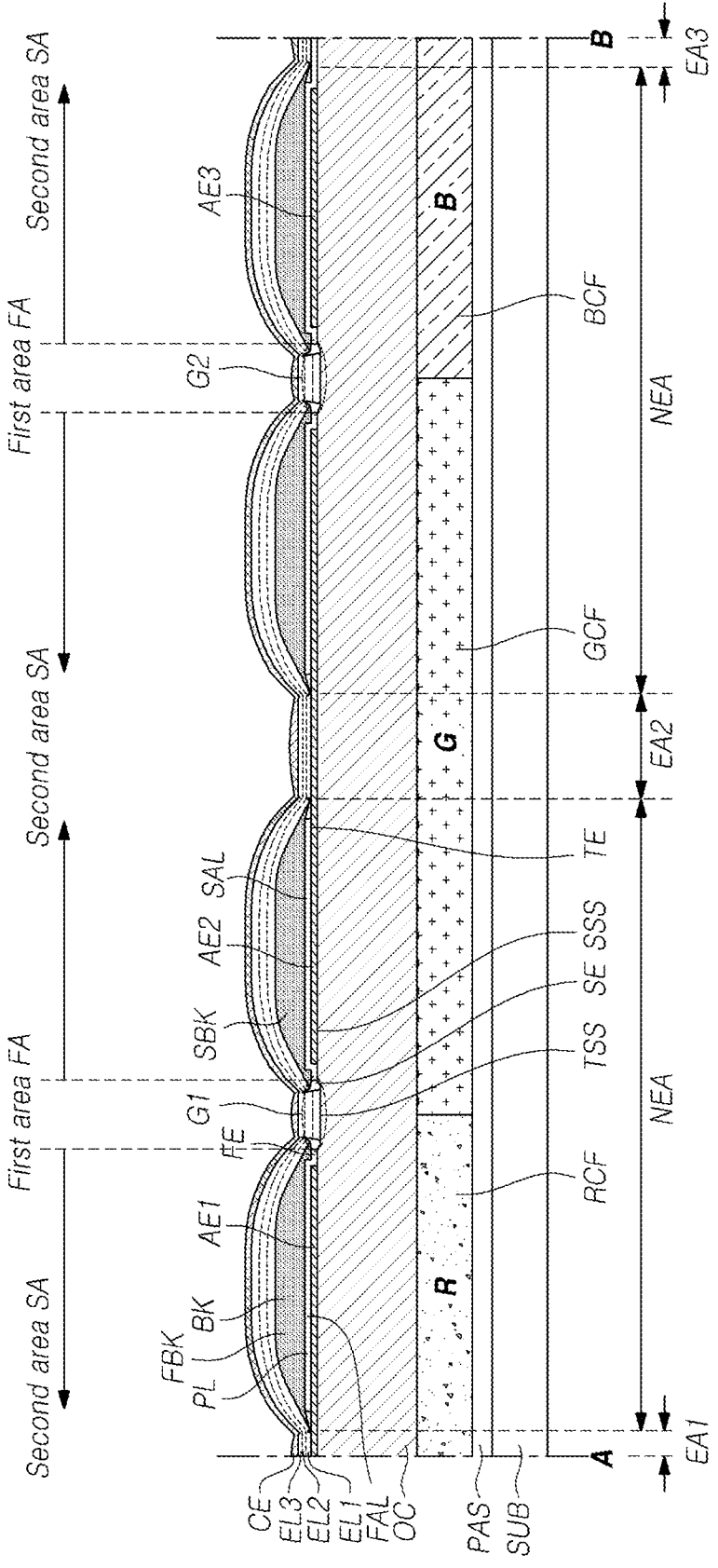
FIG. 4 is a cross-sectional view taken along line A-B of FIG. 3.
Figure 5:
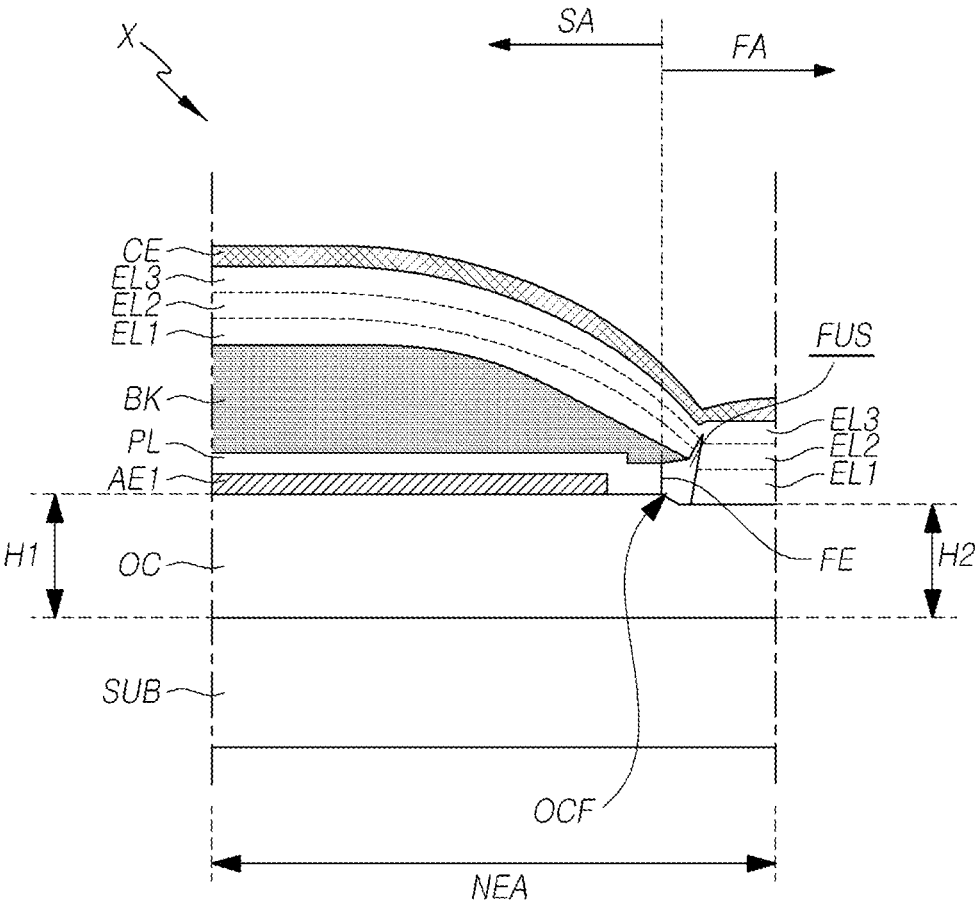
FIG. 5 is a cross-sectional view for area X of FIG. 3.
Figure 6:
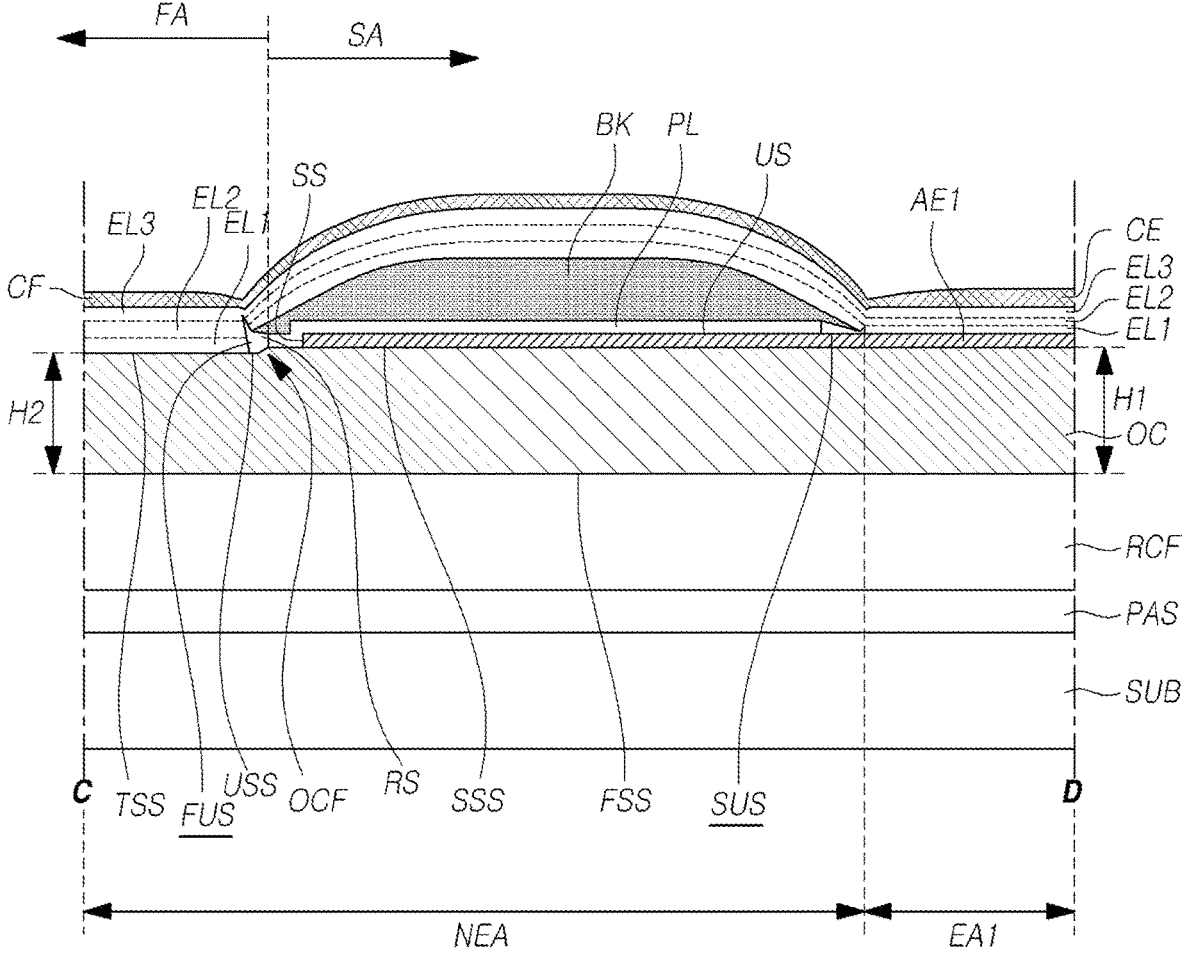
FIG. 6 is a cross-sectional view taken along line C-D of FIG. 3.
Figure 7:
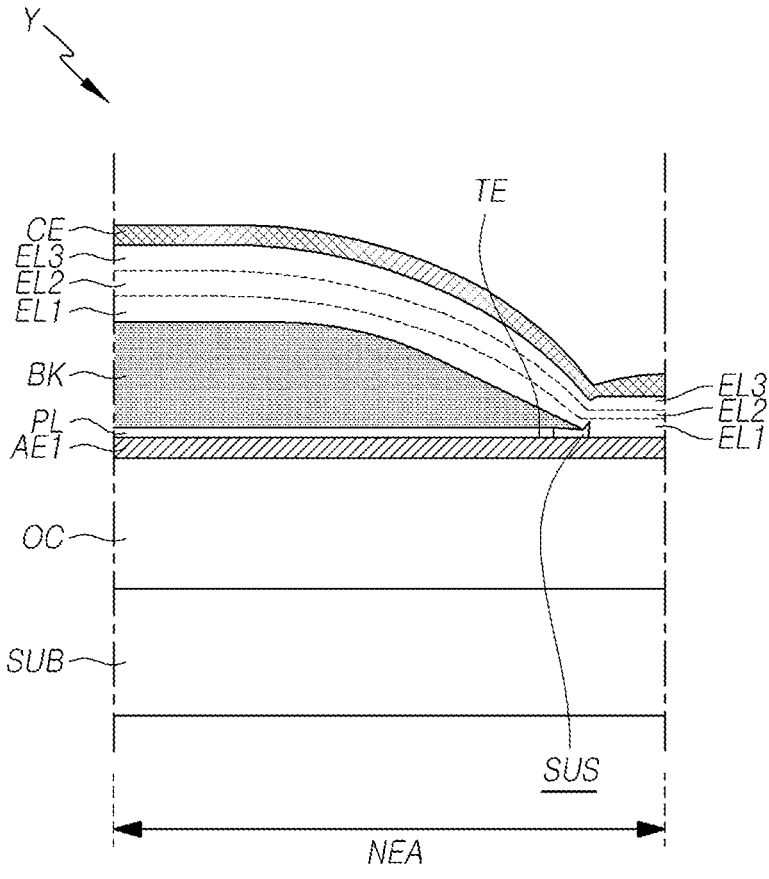
FIG. 7 is a cross-sectional view for area Y of FIG. 3.

FIG. 4 is a cross-sectional view taken along line A-B of FIG. 3. FIG. 5 is a cross-sectional view for area X of FIG. 3. FIG. 6 is a cross-sectional view taken along line C-D of FIG. 3. FIG. 7 is a cross-sectional view for area Y of FIG. 3.

First, referring to FIG. 4, at least one insulation film PAS may be disposed on the substrate SUB.

A plurality of color filters RCF, GCF, and BCF may be disposed on the insulation film PAS.

An overcoat layer OC may be disposed on the plurality of color filters RCF, GCF, and BCF. FIG. 4 illustrates a structure in which an overcoat layer OC is disposed on a plurality of color filters RCF, GCF, and BCF, but the structure according to embodiments of the disclosure is not limited thereto. For example, the plurality of color filters RCF, GCF, and BCF may be disposed on the cathode electrode CE of the light emitting element.

Although not illustrated in FIG. 4, a plurality of signal lines, a plurality of transistors, and a plurality of storage capacitors may be disposed between the substrate SUB and the overcoat layer OC.

Referring to FIG. 4, a first anode electrode AE1, a second anode electrode AE2, and a third anode electrode AE3 may be disposed on the overcoat layer OC to be spaced apart from each other.

An auxiliary layer PL may be disposed on a portion of upper surfaces of the first to third anode electrodes AE1, AE2, and AE3. The auxiliary layer PL may be disposed to surround a portion of the upper surface US and a side surface SS of each of the anode electrodes AE1, AE2, and AE3.

The auxiliary layer PL may include an inorganic insulating material. For example, the auxiliary layer PL may include silicon oxide (SiOx), silicon nitride (SiNx), or the like, but embodiments of the disclosure are not limited thereto.

The thickness of the auxiliary layer PL may be 50 Å to 500 Å. When the thickness of the auxiliary layer PL is less than 50 Å, it may be difficult to uniformly form the thickness of the auxiliary layer PL. Further, when the thickness of the auxiliary layer PL exceeds 500 Å, a break may occur in a partial area due to a step of the cathode electrode CE disposed on the auxiliary layer PL and the auxiliary layer PL, causing the light emitting element ED not to operate.

A bank BK may be disposed on the auxiliary layer PL.

Specifically, referring to FIG. 4, the bank BK may be disposed to expose a portion of the upper surface of the overcoat layer OC in an area where the first anode electrode AE1 and the auxiliary layer PL are not disposed.

Referring to FIG. 4, an area where the bank BK is disposed on the substrate SUB may be a non-emission area NEA of the display panel 110. Further, the display panel 110 according to embodiments of the disclosure may include an area where the bank BK and the first to third anode electrodes AE1, AE2, and AE3 are not disposed on the overcoat layer OC in the display area DA as the non-emission area NEA.

Referring to FIG. 4, the display panel 110 according to embodiments of the disclosure may include a first emission area EA1, a second emission area EA2, and a third emission area EA3.

The first emission area EA1 may be an area where the first light emitting layer EL1, the second light emitting layer EL2, the third light emitting layer EL3, and the cathode electrode CE are stacked on the first anode electrode AE1.

The second emission area EA2 may be an area where the first light emitting layer EL1, the second light emitting layer EL2, the third light emitting layer EL3, and the cathode electrode CE are stacked on the second anode electrode AE2.

The third emission area EA3 may be an area where the first light emitting layer EL1, the second light emitting layer EL2, the third light emitting layer EL3, and the cathode electrode CE are stacked on the third anode electrode AE3.

Referring to FIG. 4, the bank BK and the auxiliary layer PL disposed on a portion of the upper surface of each of the first to third anode electrodes AE1, AE2, and AE3 may form an undercut structure.

Referring to FIGS. 4 and 5, the undercut structure of the auxiliary layer PL and the bank BK may be present in a non-emission area NEA between emission areas emitting light of different colors.

Specifically, the bank BK may be disposed on the auxiliary layer PL.

The bank BK may be disposed to expose a portion of the upper surface of the overcoat layer OC in an area where the first anode electrode AE1 and the auxiliary layer PL are not disposed.

Referring to FIGS. 4 and 5, the bank BK may be disposed to overlap one end of the auxiliary layer PL (one end not overlapping the first to third anode electrodes AE1, AE2, and AE3).

Further, the bank BK may have a structure of protruding in a direction perpendicular to the direction in which the first anode electrode AE1 is stacked on the overcoat layer OC beyond where a side surface of the auxiliary layer PL is disposed, so that it may include an area where an edge of the bank BK does not overlap the first anode electrode AE1 and the auxiliary layer PL but overlaps the overcoat layer OC.

The area where the bank BK does not overlap the anode electrodes AE1, AE2, and AE3 and the auxiliary layer PL but overlaps the overcoat layer OC from one end of the auxiliary layer PL not overlapping each of the first to third anode electrodes AE1, AE2, and AE3 may be an area where the undercut structure (or first undercut structure FUS) is formed.

Referring to FIGS. 4 and 5, the overcoat layer OC may include at least one stepped portion OCF in an area overlapping an edge of the bank BK that does not overlap the first anode electrode AE1 and the auxiliary layer PL.

Accordingly, the overcoat layer OC may have a different height in each area. For example, a first height H1 of the overcoat layer OC in the area where the first anode electrode AE1 is disposed or the area where the auxiliary layer PL is disposed may be larger than a second height H2 of the overcoat layer OC in the area overlapping the edge of the bank BK that does not overlap the first anode electrode AE1 and the auxiliary layer PL.

As described above, the undercut structure (or the first undercut structure FUS) disposed in the non-emission area between the emission areas emitting light of different colors may be constituted of the bank BK, the auxiliary layer PL, and the stepped portion OCF of the overcoat layer OC.

Specifically, the undercut structure (first undercut structure FUS) may be constituted of the area where the auxiliary layer PL and the bank BK protrude beyond where the side surface of the auxiliary layer PL contacting the upper surface of the overcoat layer OC is disposed, in a direction perpendicular to the direction in which the first anode electrode AE1 is stacked on the overcoat layer OC, and the stepped portion OCF of the overcoat layer OC.

A plurality of organic layers CGL1, EL, and CGL2 included in the light emitting element ED may be disposed on the bank BK. The organic layers have been described as three layers in the disclosure, but may be composed of at least two or more layers, such as two or four layers.

Specifically, referring to FIGS. 4 and 5, the first light emitting layer EL1 of the light emitting element ED may be disposed on the upper surface of the bank BK and the upper surface of the overcoat layer OC not overlapping the first anode electrode AE1, the auxiliary layer PL, and the bank BK.

The first light emitting layer EL1 may include a charge transport layer, a light emitting layer, and a charge generation layer, and the overcoat layer OC may be broken at a portion corresponding to the stepped portion OCF due to the undercut structure generated by the bank BK and the auxiliary layer PL.

Referring to FIGS. 4 and 5, a second light emitting layer EL2 and a third light emitting layer EL3 may be sequentially stacked on the first light emitting layer EL1. The second light emitting layer EL2 may include a charge transport layer, a light emitting layer, and a charge generation layer, and the third light emitting layer EL3 may include a charge transport layer, a light emitting layer, and an electron injection layer, and depending on the structure, a charge injection layer, an electron prevention layer, an electron injection layer, or the like may be added to the first light emitting layer EL1, the second light emitting layer EL2, and the third light emitting layer EL3, without being limited thereto.

Each of the second light emitting layer EL2 and the third light emitting layer EL3 may be similar in thickness to or thicker than the first charge generation layer CGL1. Accordingly, the second light emitting layer EL2 and the third light emitting layer EL3 may be deposited without breaks even in the area where the undercut structure is present.

In other words, the first light emitting layer EL1 having a thickness smaller than the thickness of each of the second light emitting layer EL2 and the third light emitting layer EL3 may include a broken portion in the area where the undercut structure is present.

The height of the undercut structure may be determined in an area where the overcoat layer OC has the second height H2 due to the stepped portion OCF. Specifically, the height of the undercut structure provided in the area emitting light of different colors may be a value obtained by adding the height of the auxiliary layer PL and the height obtained by subtracting the second height H2 from the first height H1 of the overcoat layer OC.

For example, the value (the height of the undercut structure) obtained by adding the height of the auxiliary layer PL and the height obtained by subtracting the second height H2 from the first height H1 of the overcoat layer OC may be 300 Å to 1000 Å.

When the height of the undercut structure is less than 300 Å, the organic layer of the light emitting element may not be broken in the area where the uncut structure is present. However, the structure of the display panel 110 according to embodiments of the disclosure is not limited thereto, and at least one of the second light emitting layer EL2 and the third light emitting layer EL3 may not be connected in the area where the undercut structure is present.

FIGS. 4 and 5 illustrate a structure in which an organic layer of a light emitting element includes a first light emitting layer EL1, a second light emitting layer EL2, and a third light emitting layer EL3. However, the structure of the organic layer according to embodiments of the disclosure is not limited thereto, and may be formed in a multilayered structure further including at least one layer.

Referring to FIGS. 4 and 5, due to the undercut structure of the auxiliary layer PL and the bank BK, a separation space may be present between the bank BK and the overcoat layer OC in the area where the bank BK does not overlap the auxiliary layer PL.

As such, since the first light emitting layer EL1 has a structure of having at least one break between the emission areas emitting light of different colors, lateral leakage current due to the first light emitting layer EL1 may be prevented, so that a change in color coordinates may be avoided.

As shown in FIG. 4, a location where the overcoat layer OC has a change in thickness can also be referred to as a groove of the overcoat layer OC. Further, the location where the groove is located may be referred to as a first area FA and the location where the groove is not located may be referred to as a second area SA.

The thickness of the overcoat layer OC in the second area SA is defined as the thickness between a first surface FSS and a second surface SSS. This is also shown in FIG. 6 as a first height H1 (which may also refer to as a thickness). The groove is a portion that is similar to a trench. Here, a first groove G1 is between the first anode electrode AE1 and the second anode electrode AE2 and a second groove G2 is between the third anode electrode AE3 and the second anode electrode AE2. The first groove G1 (or the second groove G2) has a third surface TSS that is between the first surface FSS and the second surface SSS. The step that is present between the first surface FSS and the third surface TSS at the groove may be referred to as a stepped portion OCF. In some embodiments, the stepped portion OCF has an inclined surface that extends between the first surface FSS and the third surface TSS. The third surface TSS corresponds to an upper surface USS shown in FIG. 6.

The thickness of the overcoat layer OC in the first area FA is defined as the thickness between the third surface TSS and the second surface SSS. This is also shown in FIG. 6 as a second height H2 (which may also refer to as a thickness).

In some embodiments, the auxiliary layer PL that is disposed on the first anode electrode AE1 may be referred to as a first auxiliary layer FAL. Similarly, the auxiliary layer PL that is disposed on the second anode electrode AE2 may be referred to as a second auxiliary layer SAL. In some embodiments, the first and second anode electrodes AE1, AE2 are spaced apart from each other by the groove G1. Similarly, the first and second auxiliary layers FAL, SAL are spaced apart from each other by the groove G1.

Referring to FIG. 4, a first bank FBK is on the first anode electrode AE1 and a second bank SBK is on the second anode electrode AE2. Here, the second bank SBK and the first bank FBK are spaced apart from each other by the groove G1.

In some embodiments, at least one layer of the at least one organic layer (e.g., EL1, EL2, EL3) is disconnected at a location adjacent to the groove G1 of the overcoat layer OC (or groove G2 of the overcoat layer OC).

For example, the at least one organic layer includes a first light emitting layer EL1, a second light emitting layer EL2, and a third light emitting layer EL3. Here, the first light emitting layer EL1 can be disconnected at the location adjacent to the groove G1 of the overcoat layer OC. Further, in some cases, the second light emitting layer EL2 can be disconnected at the location adjacent to the groove G1 of the overcoat layer OC. However, the third light emitting layer EL3 can be continuously and contiguously disposed at a location where the first and second light emitting layers EL1, EL2 are disconnected. Similarly, the cathode electrode CE is continuously and contiguously disposed at a location where the first light emitting layer EL1 is disconnected.

As shown in FIG. 4, the first auxiliary layer FAL has a first end FE and the second auxiliary layer SAL has a second end SE and a third end TE opposite the second end SE. Here, the first end FE of the first auxiliary layer FAL faces the second end SE of the second auxiliary layer SAL. Further, the first light emitting layer EL1 is not disconnected at the location adjacent to the third end TE of the second auxiliary layer SAL. On the other hand, in some embodiments, the first light emitting layer EL1 can be disconnected at the location adjacent to the second end SE of the second auxiliary layer SAL.

Further, referring to FIGS. 6 and 7, the bank BK may be disposed only in a portion of the non-emission area NEA disposed between the emission areas emitting light of the same color (e.g., between a red emission area and another red emission area, between a green emission area and another green emission area, or between a blue emission area and another blue emission area), and the bank BK may not be disposed in another portion.

Referring to FIGS. 6 and 7, the display panel 110 according to embodiments of the disclosure may be provided with an undercut structure in a portion of the area where the auxiliary layer PL and the bank BK are disposed even between the emission areas emitting light of the same color.

Specifically, referring to FIGS. 6 and 7, an undercut structure may be provided due to the auxiliary layer PL and the bank BK in the area corresponding to a portion of the upper surface of each of the first to third anode electrodes AE1, AE2, and AE3.

As illustrated in FIGS. 6 and 7, the auxiliary layer PL may be disposed on a portion of the upper surface of each of the first to third anode electrodes AE1, AE2, and AE3.

A bank BK may be disposed on the auxiliary layer PL.

The bank BK may be disposed to overlap one end of the auxiliary layer PL (one end overlapping the first to third anode electrodes AE1, AE2, and AE3).

Further, as the bank BK has a structure of protruding in a direction perpendicular to the direction in which the first anode electrode AE1 is stacked on the overcoat layer OC, it may include an area where an edge of the bank BK does not overlap the auxiliary layer PL but overlaps each of the first to third anode electrodes AE1, AE2, and AE3.

The area where the bank BK protrudes beyond where a side surface of the auxiliary layer PL is disposed, in a direction perpendicular to the direction in which the first anode electrode AE1 is stacked on the overcoat layer OC may be the area where an undercut structure (or second undercut structure SUS) is formed.

Meanwhile, a stepped portion of the overcoat layer OC may not be formed in an area overlapping the undercut structure provided on the first to third anode electrodes AE1, AE2, and AE3. The second undercut structure SUS may be constituted of the area where the auxiliary layer PL and the bank BK protrude beyond where the side surface of the auxiliary layer PL is disposed, in the direction perpendicular to the direction in which the first anode electrode AE1 is stacked on the overcoat layer OC.

Referring to FIG. 6, as the bank BK has a structure of protruding beyond where the side surface of the auxiliary layer PL is disposed, in the direction perpendicular to the direction in which the first anode electrode AE1 is disposed on the overcoat layer OC, the bank BK and the auxiliary layer PL may form an undercut structure.

In other words, the undercut structure formed on the first to third anode electrodes AE1, AE2, and AE3 may be provided through the bank BK and the auxiliary layer PL.

Referring to FIG. 6, the overcoat layer OC may include at least one stepped portion OCF in an area overlapping an edge of the bank BK that does not overlap the first anode electrode AE1 and the auxiliary layer PL. Thus, a first height H1 of the overcoat layer OC in the area where the first anode electrode AE1 is disposed or the area where the auxiliary layer PL is disposed may be larger than a second height H2 of the overcoat layer OC in the area overlapping the edge of the bank BK that does not overlap the first anode electrode AE1 and the auxiliary layer PL.

Referring to FIGS. 6 and 7, the first light emitting layer EL1, the second light emitting layer EL2, and the third light emitting layer EL3 of the light emitting element may be disposed on the substrate SUB on which the bank BK is disposed.

However, since the height of the undercut structure provided on the first to third anode electrodes AE1, AE2, and AE3 is smaller than the height of the undercut structure provided in the area that does not overlap the first to third anode electrodes AE1, AE2, and AE3, the first light emitting layer EL1 may be connected rather than being completely broken.

Specifically, the height of the undercut structure present between the emission areas emitting light of the same color may be a value of the height of the auxiliary layer PL. In other words, the height of the undercut structure present between the emission areas emitting light of the same color may be smaller than the height of the undercut structure provided in the areas emitting light of different colors by a height obtained by subtracting the second height H2 from the first height H1 of the overcoat layer OC.

The second light emitting layer EL2, the third light emitting layer EL3, and the cathode electrode CE may be disposed on the first light emitting layer EL1.

Further, light may be emitted in the area where the multi-layered organic layers CGL1, EL, CGL2 and the cathode electrode CE are disposed on the upper surfaces of the first to third anode electrodes AE1, AE2, and AE3.

As such, in the display panel 110 according to embodiments of the disclosure, the height of the undercut structure disposed in the non-emission area NEA between the emission areas EA1. EA2, and EA3 emitting light of different colors and between the emission areas (e.g., between EA1 and EA1, between EA2 and EA2, between EA3 and EA3) emitting light of the same color may be different from the height of the undercut structure disposed on the anode electrodes AE1, AE2, and AE3.

Accordingly, the display panel 110 according to embodiments of the disclosure may have a structure in which the organic layer (e.g., the first light emitting layer EL1) of the light emitting element is broken due to the undercut structure disposed in the non-emission area NEA between the emission areas EA1, EA2, and EA3 emitting light of different colors and between the emission areas (e.g., between EA1 and EA1, between EA2 and EA2, and between EA3 and EA3) emitting light of the same color and, in the undercut structure disposed on the anode electrodes AE1. AE2, and AE3, the organic layer (e.g., the first light emitting layer EL1) of the light emitting element is not broken.

In some embodiments, the auxiliary layer PL contacts the upper surface US and side surface SS of the first anode electrode AE1. Here, the auxiliary layer PL does not overlap with the groove from a plan view.

In some embodiments, a color filter layer is between the overcoat layer OC and the substrate SUB. The color filter layer includes a first color filter of a first color (e.g., red, RCF) and a second color filter of a second color (e.g., green, GCF) different from the first color (e.g., red). In some instances, a location where the first color filter RCF and the second color filter GCF abuts overlaps with the groove of the overcoat layer OC from a plan view.

In some embodiments, the first color filter RCF of the color filter layer fully overlaps with the first bank FBK from a plan view.

Next, a manufacturing process of the display panel 110 according to embodiments of the disclosure is briefly described below.

Figure 8:
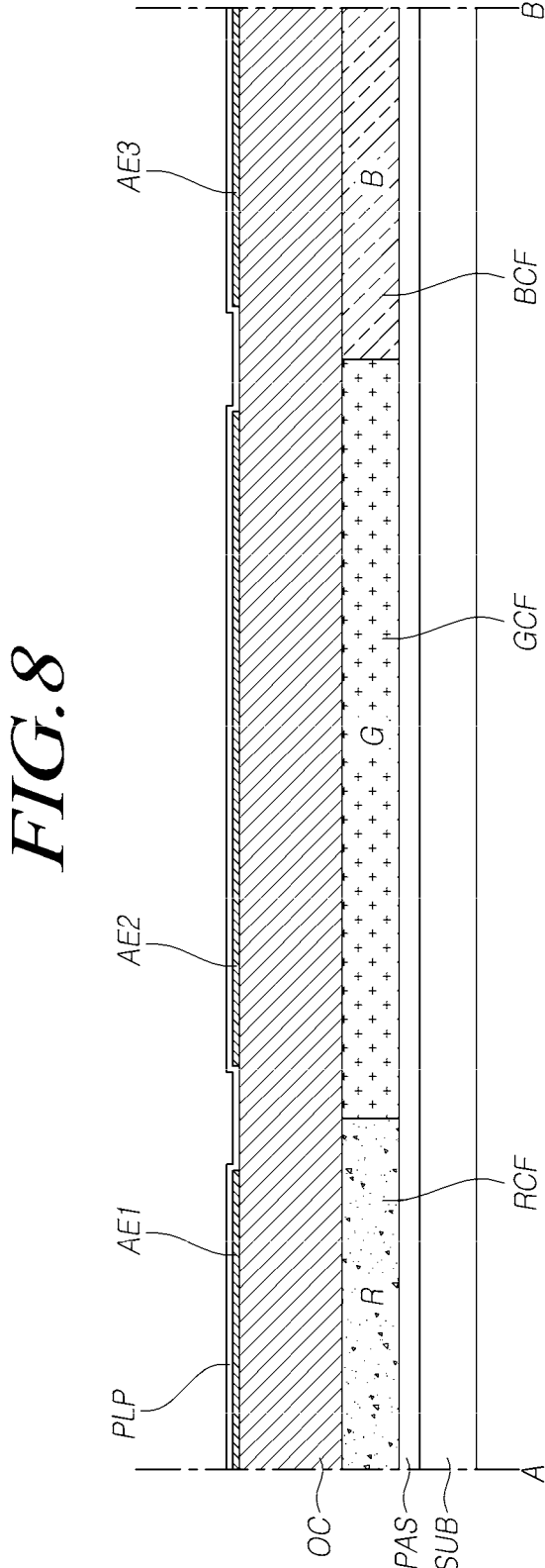
FIGS. 8, 9, and 10 are views schematically illustrating part of a manufacturing process of the display panel illustrated in FIGS. 3 to 7.
Figure 8:
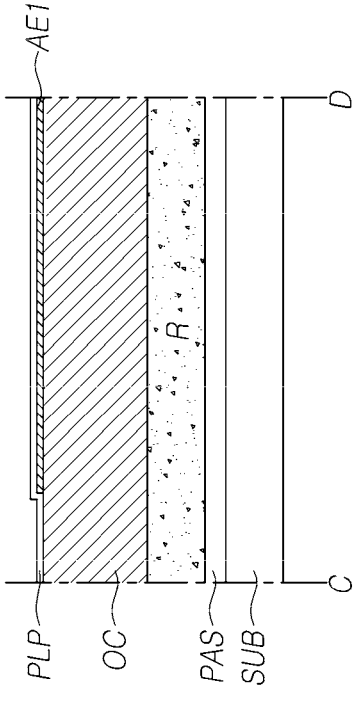
Figure 9:
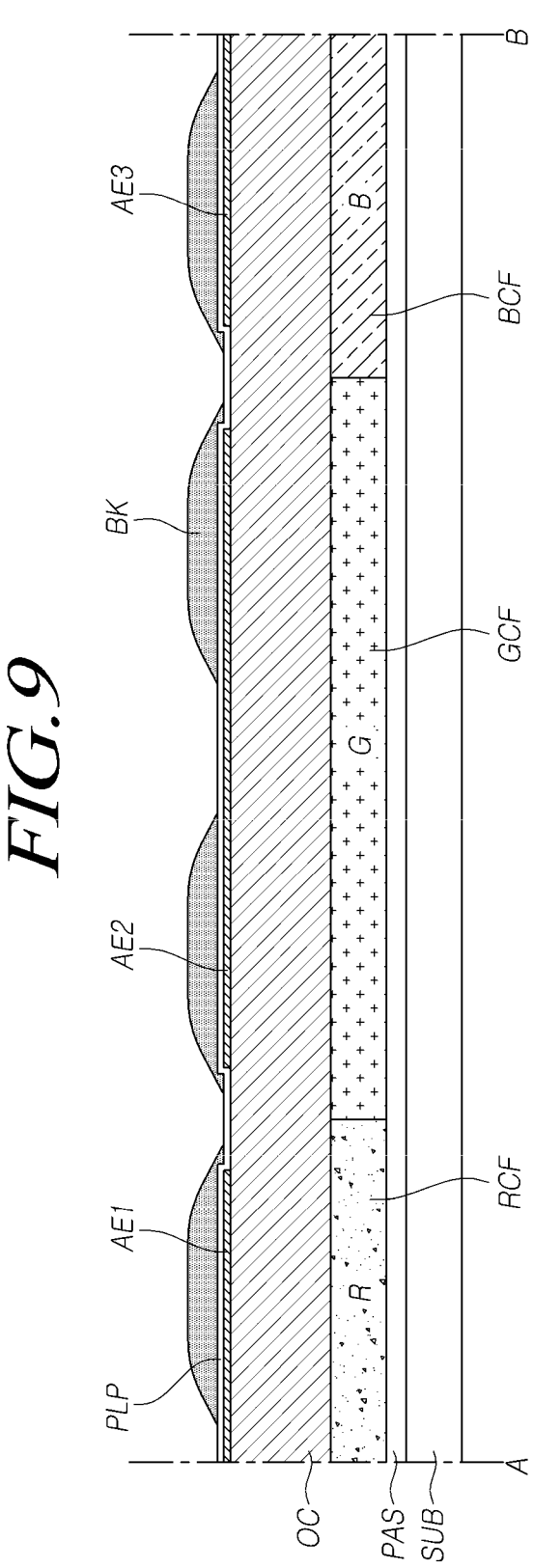
Figure 9:
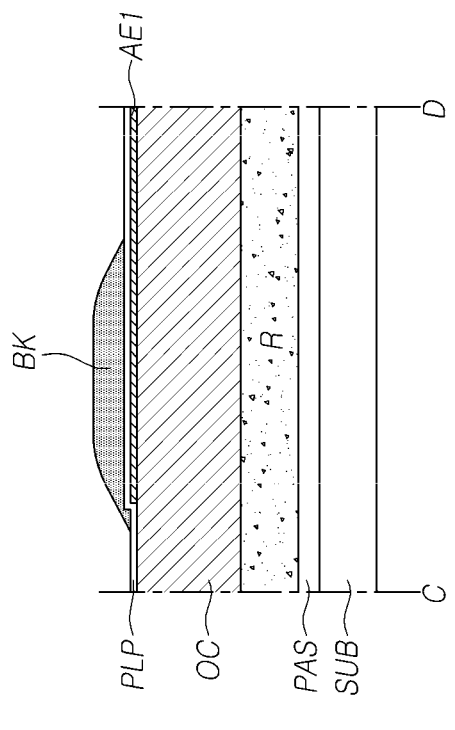
Figure 10:
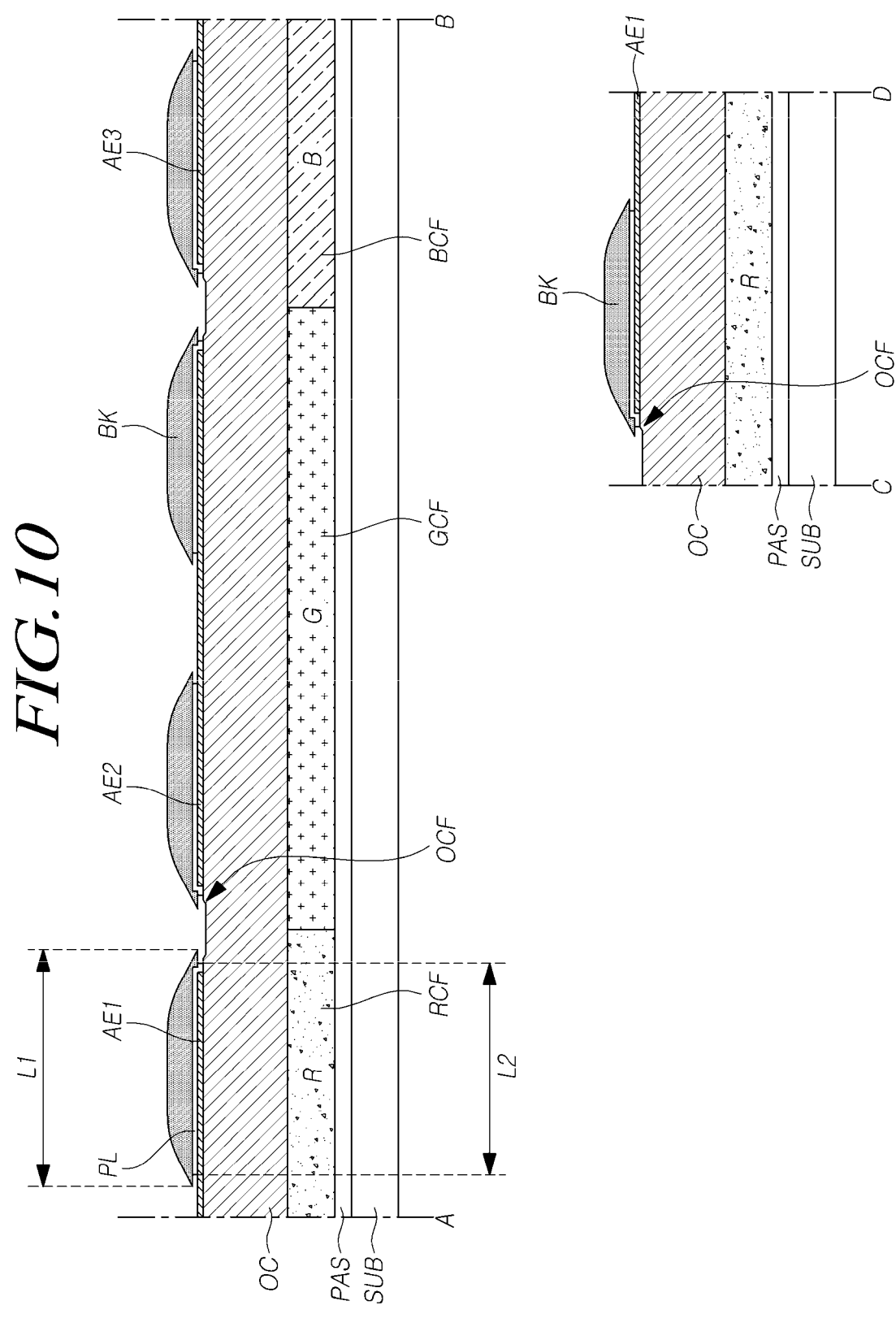

FIGS. 8, 9, and 10 are views schematically illustrating part of a manufacturing process of the display panel illustrated in FIGS. 3 to 7.

First, referring to FIG. 8, an insulation film PAS may be disposed on the substrate SUB.

A red color filter RCF, a green color filter GCF, and a blue color filter BCF may be disposed on the insulation film PAS.

An overcoat layer OC may be disposed on the red color filter RCF, the green color filter GCF, and the blue color filter BCF, and a plurality of anode electrodes AE1, AE2, and AE3 may be disposed on the overcoat layer OC.

An auxiliary layer material PLP may be disposed on the substrate SUB on which the plurality of anode electrodes AE1, AE2, and AE3 are disposed.

Thereafter, referring to FIG. 9, a bank BK may be disposed on the auxiliary layer material PLP.

The bank BK may include a plurality of openings and a plurality of holes.

The plurality of openings of the bank BK may overlap the plurality of anode electrodes AE1, AE2, and AE3, and the plurality of holes of the bank BK may overlap a portion of the non-emission area NEA between the emission areas.

Referring to FIG. 9, the bank BK may be disposed to overlap a portion of the upper surface of each of the first anode electrode AE1, the second anode electrode AE2, and the third anode electrode AE3, and to overlap a portion of the overcoat layer OC that does not overlap the first anode electrode AE1, the second anode electrode AE2, and the third anode electrode AE3.

Thereafter, referring to FIG. 10, the auxiliary layer material PLP may be etched using the bank BK as a mask. The entire auxiliary layer material PLP in the area where the bank BK is not present may be etched, and the auxiliary layer material PLP overlapping the edge of the bank BK may also be etched.

After the auxiliary layer material PLP is etched, an auxiliary layer PL provided under the bank BK may be formed as illustrated in FIG. 10.

The width L1 of the bank BK may be larger than the width L2 of the auxiliary layer PL at cross-sectional view. Here, the width L1 of the bank BK and the width L2 of the auxiliary layer PL may mean the maximum length in a direction perpendicular to the direction in which the first anode electrode AE1 is stacked on the overcoat layer OC.

Accordingly, the entire auxiliary layer PL may overlap a portion of the bank BK. Accordingly, an undercut structure using the auxiliary layer PL and the bank BK may be formed.

Referring to FIG. 10, in the process of etching the auxiliary layer PL material, in an area where the first to third anode electrodes AE1, AE2, and AE3 are not disposed on the overcoat layer OC, a portion of the overcoat layer OC may be etched, reducing the thickness of the overcoat layer in FIG. 5 and forming a second height H2.

Accordingly, in the area where the first to third anode electrodes AE1. AE2, and AE3 are not disposed, a recess may be formed in the overcoat layer OC. Accordingly, a stepped portion OCF of the overcoat layer OC may occur at the boundary between the area where the first to third anode electrodes AE1, AE2, and AE3 are disposed and the area where the first to third anode electrodes AE1, AE2, and AE3 are not disposed. Here, at least a portion of a side surface of the recess of the overcoat layer OC may be a stepped portion OCF.

Thus, as mentioned above, in the area where the stepped portion OCF is formed due to the recess of the overcoat layer OC, the height of the undercut structure may be a value obtained by adding the height of the auxiliary layer PL and the height obtained by subtracting the second height H2 from the first height H1 of the overcoat layer OC.

Further, the height of the undercut structure formed of the auxiliary layer PL and the bank BK present on the plurality of anode electrodes AE1, AE2, and AE3, i.e., the area where no recess is formed in the overcoat layer OC, may be the same as the height of the auxiliary layer PL.

As described above, the height of the undercut structure may differ per area through the stepped portion OCF formed due to the recess of the overcoat layer OC, and a portion of the organic layer of the light emitting element may be broken in a partial area through height adjustment of the undercut structure, preventing light emission in an area other than the emission area.

Figure 11:
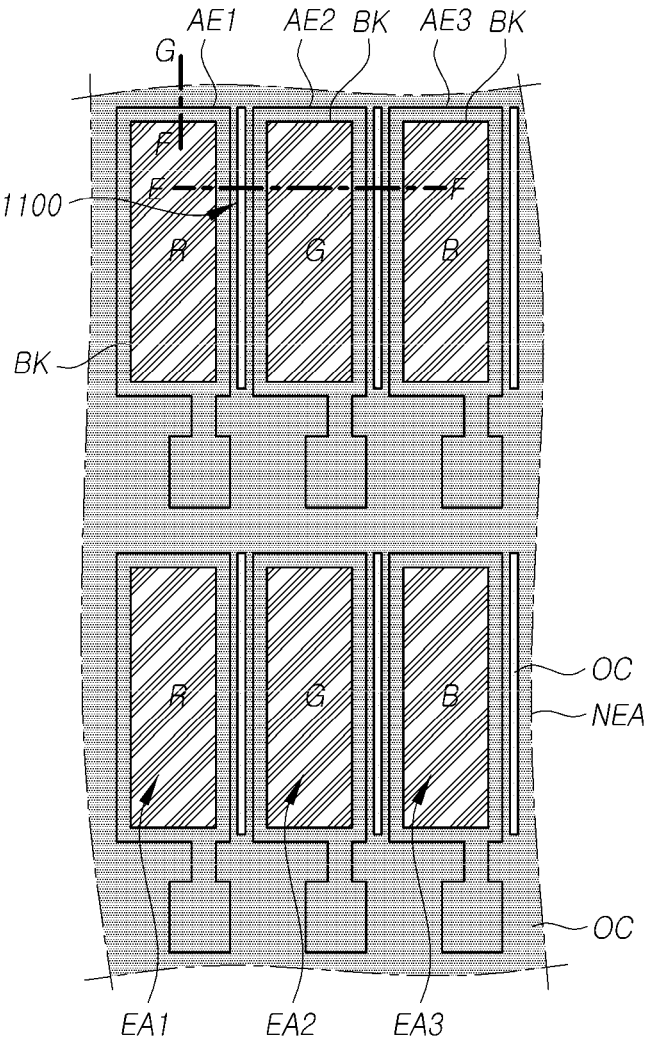
FIG. 11 is a view illustrating a portion of a display area of a display device according to embodiments of the disclosure.
Figure 12:
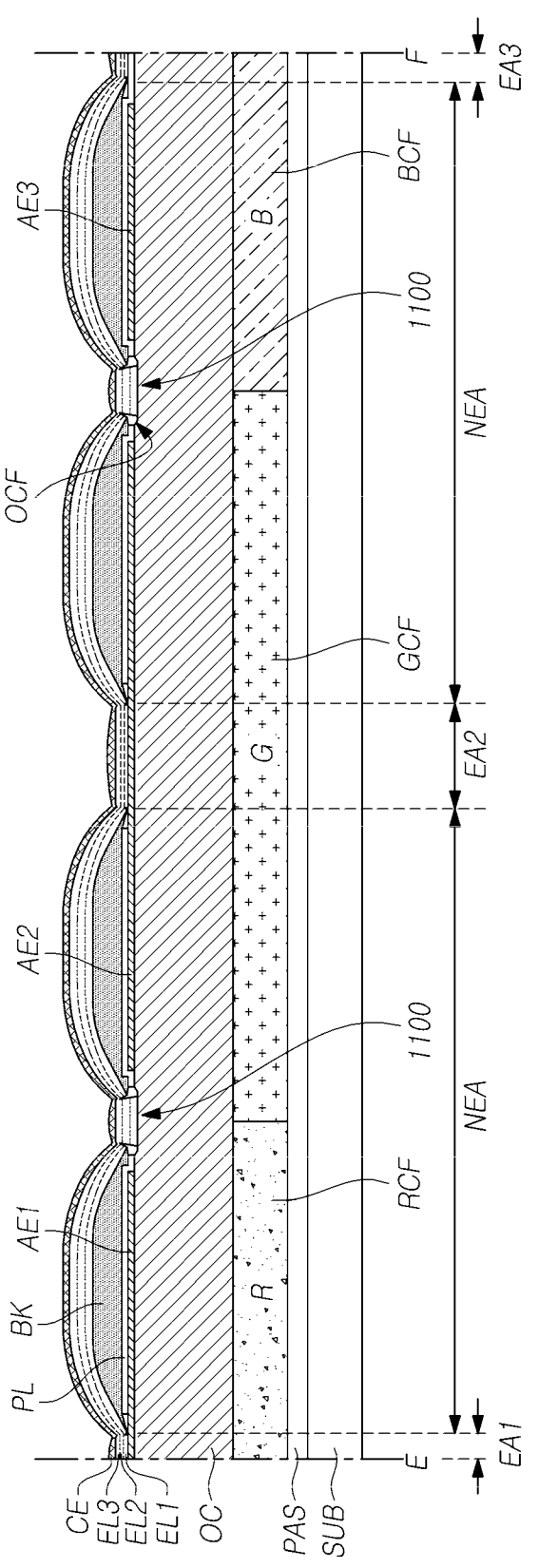
FIG. 12 is a cross-sectional view taken along line E-F of FIG. 11.
Figure 13:
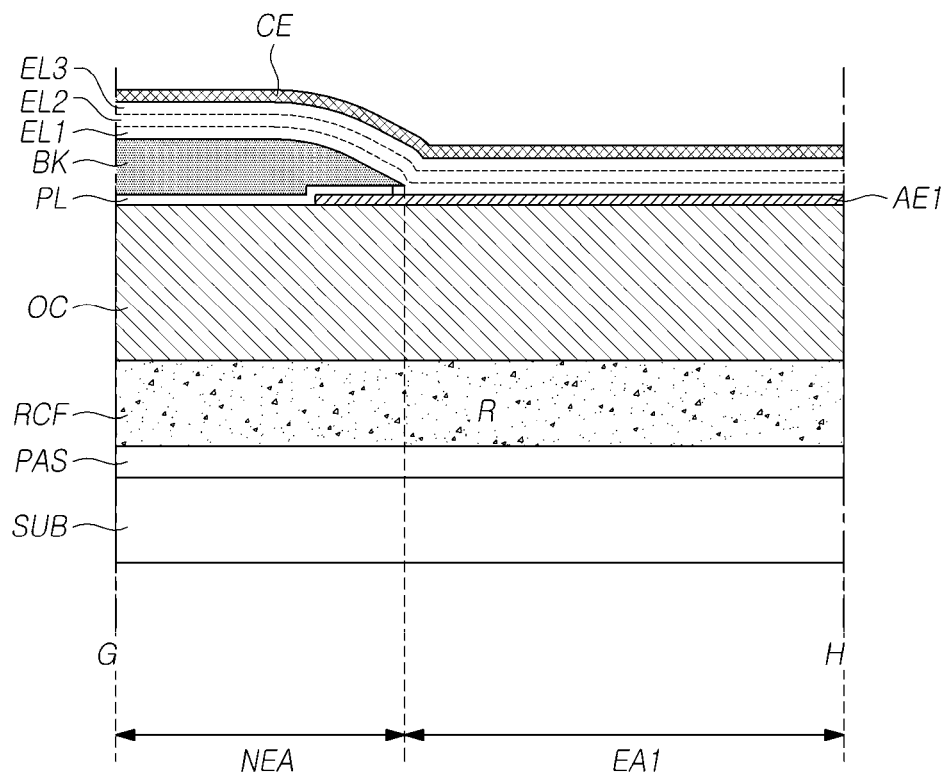
FIG. 13 is a cross-sectional view taken along line G-H of FIG. 11.

FIG. 11 is a view illustrating a portion of a display area of a display device according to embodiments of the disclosure. FIG. 12 is a cross-sectional view taken along line E-F of FIG. 11. FIG. 13 is a cross-sectional view taken along line G-H of FIG. 11.

Referring to FIGS. 11 and 12, the display area DA of the display panel 110 according to embodiments of the disclosure may include a plurality of emission areas EA1, EA2, and EA3 and a non-emission area NEA surrounding the plurality of emission areas EA1, EA2, and EA3.

A bank BK exposing a portion of an upper surface of each of the plurality of anode electrodes AE1, AE2, and AE3 may be disposed on the plurality of anode electrodes AE1, AE2, and AE3. As illustrated in FIG. 11, the upper surface of each of the plurality of anode electrodes AE1, AE2, and AE3 may overlap an opening provided in the bank BK.

Further, the bank BK may include a plurality of holes 1100 exposing the overcoat layer OC disposed under the bank BK.

Referring to FIGS. 11 and 12, the hole 1100 of the bank BK may be disposed in a portion of the non-emission area NEA present between different emission areas disposed adjacent to each other.

The cross-sectional structure of the emission areas EA1, EA2, and EA3 emitting light of different colors and the non-emission area NEA disposed between the emission areas EA1, EA2, and EA3 emitting light of different colors may be substantially the same as that of FIG. 4.

Referring to FIGS. 11 and 13, a bank BK may be disposed in the entire non-emission area NEA disposed between emission areas emitting light of the same color (e.g., between EA1 and EA1, between EA2 and EA2, or between EA3 and EA3).

The auxiliary layer PL may be disposed under the bank BK.

However, as the bank BK is disposed in the entire non-emission area NEA disposed between the emission areas emitting light of the same color (e.g., between EA1 and EA1, between EA2 and EA2, or between EA3 and EA3), as illustrated in FIG. 13, the undercut structure formed of the auxiliary layer PL and the bank BK may not be disposed in the non-emission area NEA between the first anode electrode AE1 and another first anode electrode AE1.

Further, as illustrated in FIG. 13, the bank BK and the auxiliary layer PL may be disposed on a portion of the upper surface of the first anode electrode AE1, and the area where the bank BK and the first anode electrode AE1 overlap may be greater than the area where the auxiliary layer PL and the first anode electrode AE1 overlap.

On the other hand, referring to FIG. 13, an undercut structure due to the auxiliary layer PL and the bank BK may be provided in the area corresponding to a portion of the upper surface of each of the first anode electrodes AE1.

FIG. 13 illustrates a structure in which an undercut structure is disposed on the first anode electrode AE1, but an undercut structure constituted of a bank BK and an auxiliary layer PL may also be provided on the second anode electrode AE2 and the third anode electrode AE3.

Specifically, as the bank BK has a structure of protruding in a direction perpendicular to the direction in which the first anode electrode AE1 is stacked on the overcoat layer OC, it may include an area where an edge of the bank BK does not overlap the auxiliary layer PL but overlaps each of the first to third anode electrodes AE1, AE2, and AE3.

As the bank BK has a structure of protruding from one end of the auxiliary layer PL overlapping each of the first to third anode electrodes AE1, AE2, and AE3 in a direction perpendicular to the direction in which the first anode electrode AE1 is stacked on the overcoat layer OC, an undercut structure due to the bank BK and the auxiliary layer PL may be provided.

Referring to FIG. 13, the first light emitting layer EL1, the second light emitting layer EL2, and the third light emitting layer EL3 of the light emitting element may be disposed on the substrate SUB on which the bank BK is disposed.

Since the height of the undercut structure provided on the first to third anode electrodes AE1, AE2, and AE3 is low, the first light emitting layer EL1 may be connected without being completely broken.

In other words, in the non-emission area NEA between the emission areas emitting light of the same color and the emission areas emitting light of the same color in the display panel 110 according to embodiments of the disclosure, an area where a portion of the organic layer is broken in a partial area without extending may not be present.

However, in the non-emission area NEA between the emission areas emitting light of different colors, an area where a portion of the organic layer of the light emitting element is broken in a partial area without extending may be present.

Next, a manufacturing process of the display panel 110 according to embodiments of the disclosure is briefly described below.

Figure 14:
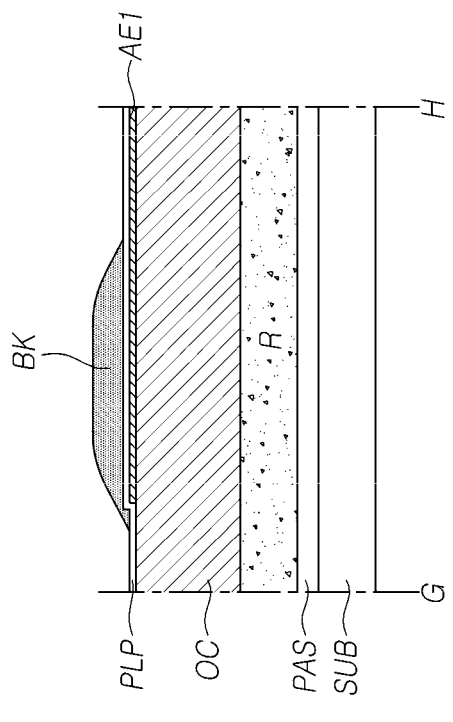
FIGS. 14 and 15 are views schematically illustrating part of a manufacturing process of the display panel illustrated in FIGS. 11 to 13.
Figure 15:
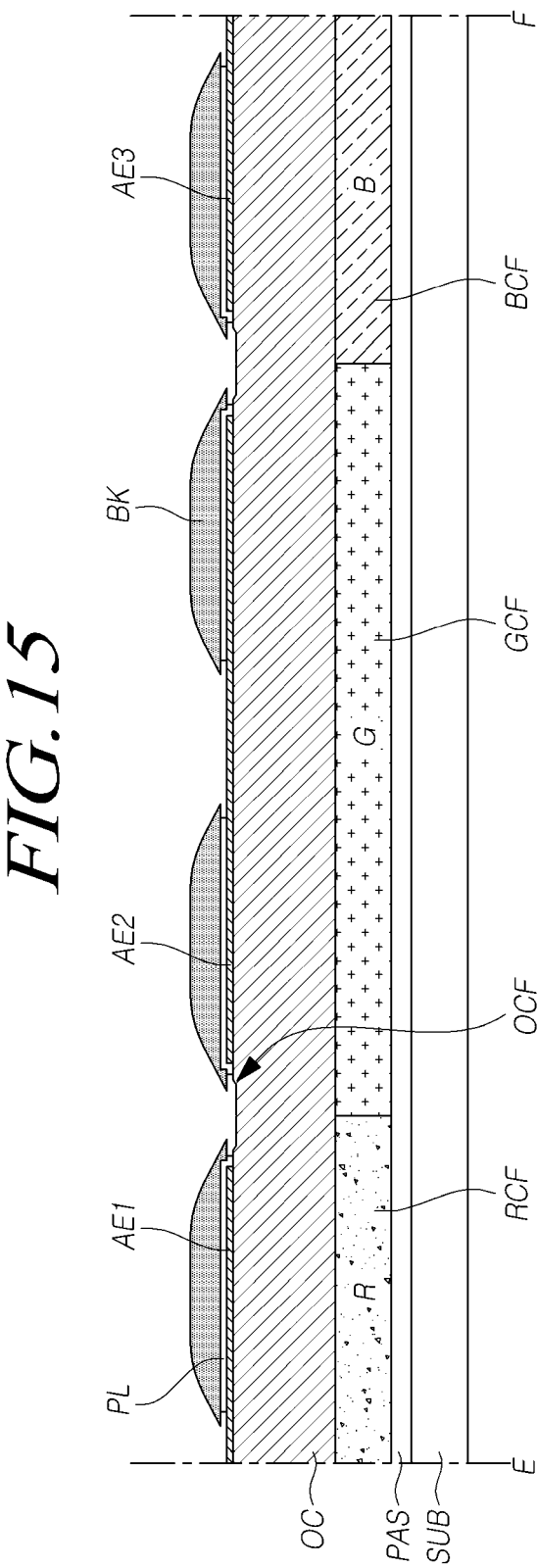
Figure 15:
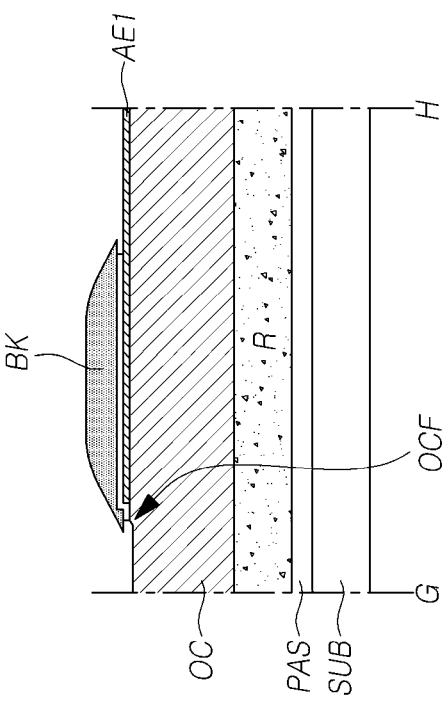

FIGS. 14 and 15 are views schematically illustrating part of a manufacturing process of the display panel illustrated in FIGS. 11 to 13.

First, referring to FIG. 14, an insulation film PAS, a plurality of color filters RCF. GCF, and BCF, an overcoat layer OC, and a plurality of anode electrodes AE1, AE2, and AE3 may be disposed on the substrate SUB.

An auxiliary layer material PLP may be disposed on the substrate SUB on which the plurality of anode electrodes AE1, AE2, and AE3 are disposed.

The auxiliary layer material PLP may include an inorganic insulating material. For example, the auxiliary layer PL may include silicon oxide (SiOx), silicon nitride (SiNx), or the like, but embodiments of the disclosure are not limited thereto.

Referring to FIG. 14, the bank BK may be disposed to expose a portion of the upper surfaces of the plurality of anode electrodes AE1, AE2, and AE3.

Further, the bank BK may not be disposed in a partial area between the first anode electrode AE1 and the second anode electrode AE2, between the second anode electrode AE2 and the third anode electrode AE3, and between the third anode electrode AE3 and the first anode electrode AE1.

On the other hand, the bank BK may be disposed in an area between the first anode electrode AE1 and another first anode electrode AE1, between the second anode electrode AE2 and another second anode electrode AE2, and between the third anode electrode AE3 and another third anode electrode AE3.

Thereafter, referring to FIG. 15, the auxiliary layer material PLP may be etched using the bank BK as a mask. The auxiliary layer material PLP may be etched using the bank BK as a mask. The entire auxiliary layer material PLP in the area where the bank BK is not present may be etched, and the auxiliary layer material PLP overlapping the edge of the bank BK may also be etched.

After the auxiliary layer material PLP is etched, an auxiliary layer PL provided under the bank BK may be formed as illustrated in FIG. 15.

Referring to FIG. 15, a portion of the overcoat layer OC may be etched in an area where the first to third anode electrodes AE1, AE2, and AE3 are not disposed on the overcoat layer OC, among areas between the first anode electrode AE1 and another first anode electrode AE1, between the second anode electrode AE2 and another second anode electrode AE2, and between the third anode electrode AE3 and another third anode electrode AE3.

Accordingly, in the area where the first to third anode electrodes AE1, AE2, and AE3 are not disposed, a recess may be formed in the overcoat layer OC. Accordingly, a stepped portion OCF of the overcoat layer OC may occur at the boundary between the area where the first to third anode electrodes AE1, AE2, and AE3 are disposed and the area where the first to third anode electrodes AE1, AE2, and AE3 are not disposed.

On the other hand, the bank BK may be disposed on the auxiliary layer PL in an area between the first anode electrode AE1 and another first anode electrode AE1, between the second anode electrode AE2 and another second anode electrode AE2, and between the third anode electrode AE3 and another third anode electrode AE3.

Referring to FIG. 15, an undercut structure overlapping the plurality of anode electrodes AE1, AE2, and AE3 may also be formed.

The height of the undercut structure (a value obtained by adding the height of the auxiliary layer PL and the height obtained by subtracting the second height H2 from the first height H1 of the overcoat layer OC) in the area not overlapping the anode electrodes AE1, AE2, and AE3 may be larger than the height of the undercut structure (the height of the auxiliary layer PL) in the area overlapping the anode electrodes AE1, AE2, and AE3.

As described above, the display panel 110 according to embodiments of the disclosure may have a structure in which a portion of the organic layer of the light emitting element is broken only in the non-emission area NEA between the emission areas emitting light of different colors, thereby preventing light from being emitted in an area other than the emission area.

Figure 16:
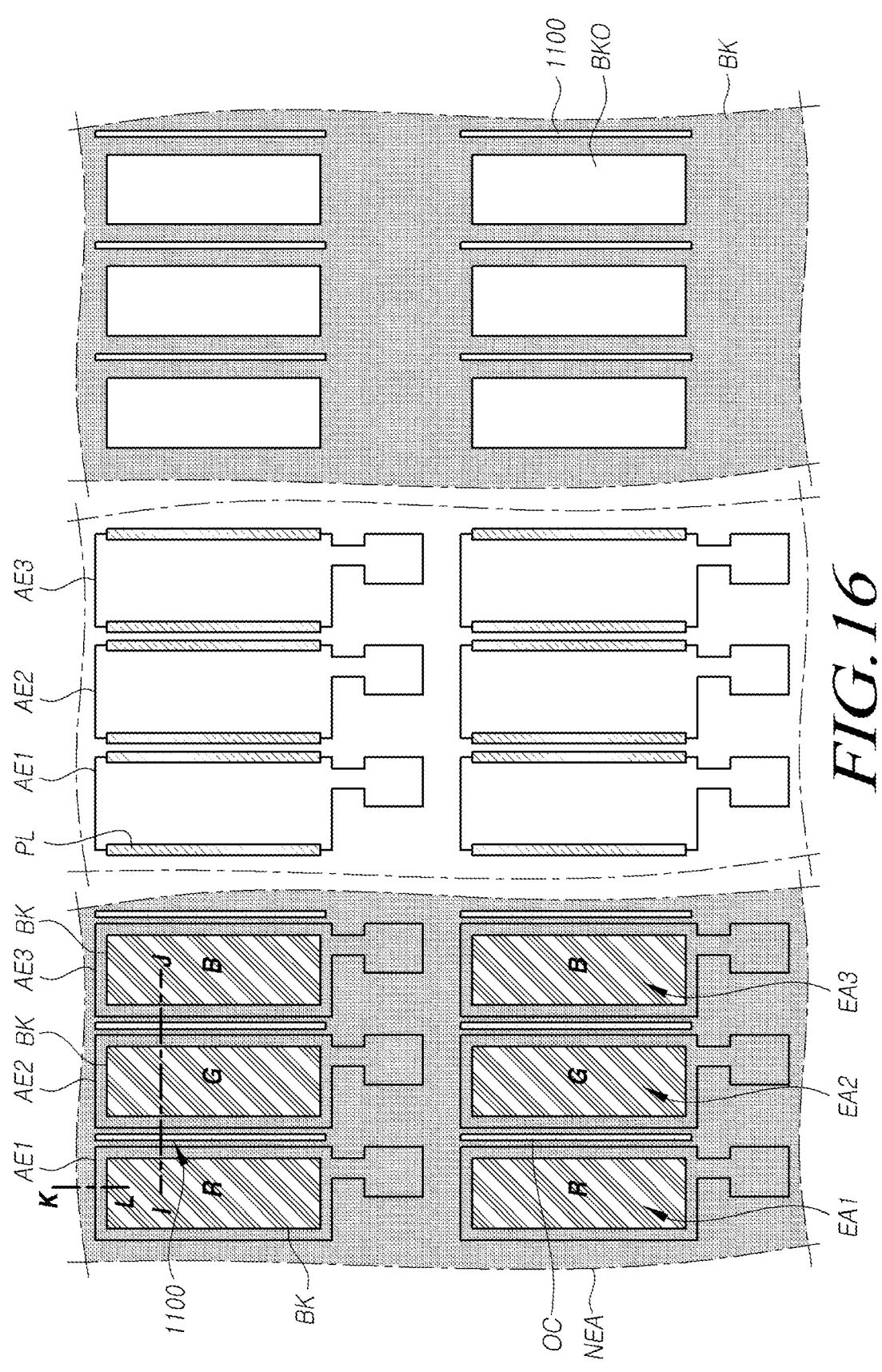
FIG. 16 is a view schematically illustrating a planar structure of a display panel according to embodiments of the disclosure.
Figure 17:
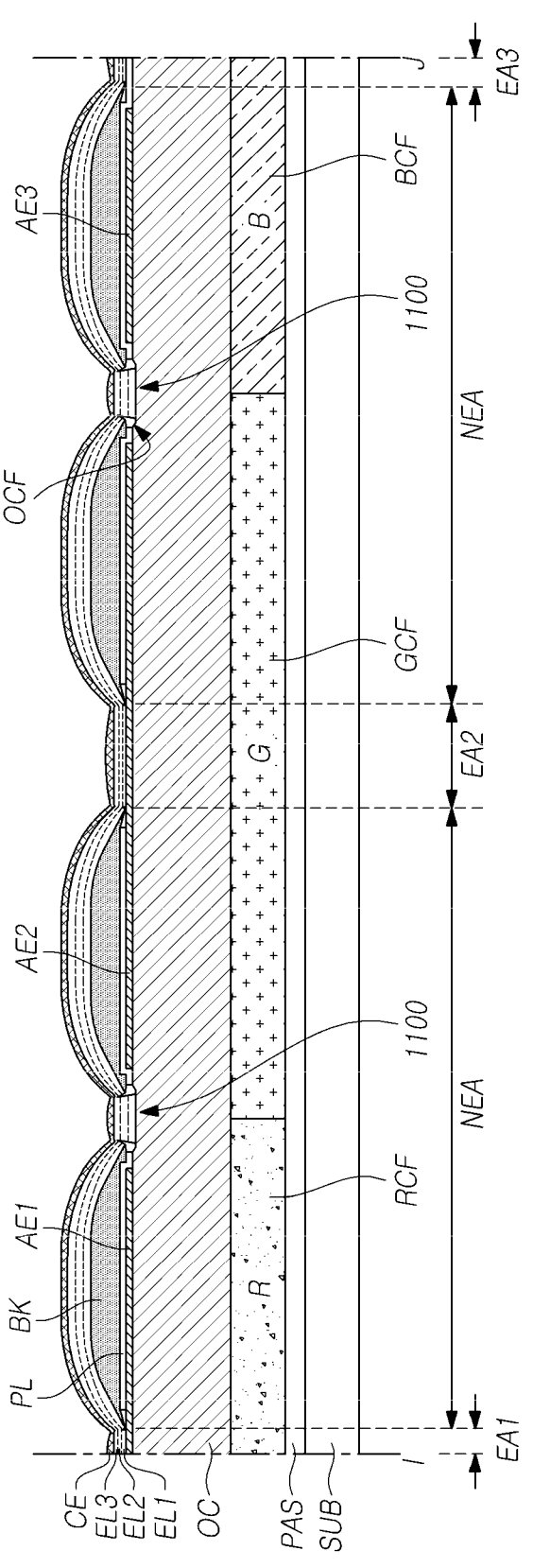
FIG. 17 is a cross-sectional view taken along line I-J of FIG. 16.
Figure 18:
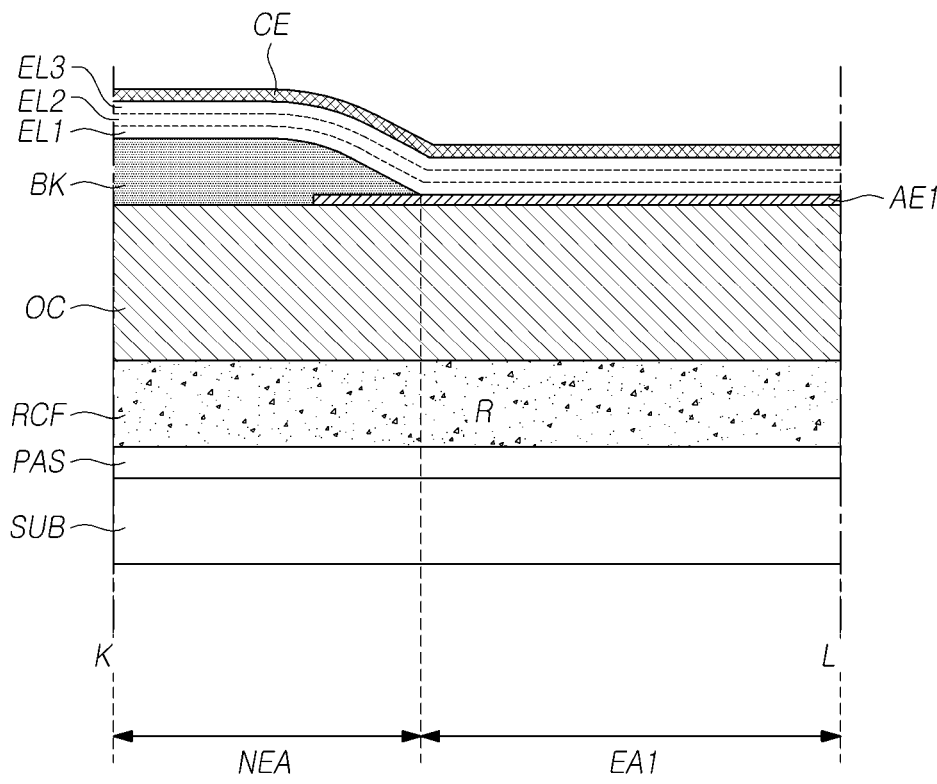
FIG. 18 is a cross-sectional view taken along line K-L of FIG. 16.

FIG. 16 is a view schematically illustrating a planar structure of a display panel according to embodiments of the disclosure. FIG. 17 is a cross-sectional view taken along line I-J of FIG. 16. FIG. 18 is a cross-sectional view taken along line K-L of FIG. 16.

Referring to FIGS. 16 and 17, the display area DA of the display panel 110 according to embodiments of the disclosure may include a plurality of emission areas EA1, EA2, and EA3 and a non-emission area NEA surrounding the plurality of emission areas EA1, EA2, and EA3.

Referring to FIGS. 16 and 17, the auxiliary layer PL may be disposed on a plurality of anode electrodes AE1. AE2, and AE3.

Specifically, the auxiliary layer PL may overlap a portion of an edge of each of the first to third anode electrodes AE1, AE2, and AE3, and may also be disposed on a portion of an upper surface of the overcoat layer OC in which the first to third anode electrodes AE1, AE2, and AE3 are not disposed. The auxiliary layer PL may be disposed between emission areas emitting light of different colors.

Further, referring to FIG. 16, the auxiliary layer PL may not be disposed at an edge of each of the first to third anode electrodes AE1, AE2, and AE3 in an area between emission areas emitting light of the same color, and may not be disposed on the overcoat layer OC.

Referring to FIGS. 16 and 17, a bank BK exposing a portion of an upper surface of each of the plurality of anode electrodes AE1, AE2, and AE3 may be disposed on the plurality of anode electrodes AE1, AE2, and AE3. As illustrated in FIG. 16, the upper surface of each of the plurality of anode electrodes AE1, AE2, and AE3 may overlap an opening BKO provided in the bank BK.

Further, the bank BK may include at least one hole 1100 exposing a portion of the upper surface of the overcoat layer OC between the emission areas EA1, EA2, and EA3 emitting light of different colors and the emission areas EA1, EA2, and EA3 emitting light of different colors.

The cross-sectional structure (the structure of FIG. 17) of the emission areas EA1, EA2, and EA3 emitting light of different colors and the non-emission area NEA disposed between the emission areas EA1, EA2, and EA3 emitting light of different colors may be substantially the same as that of FIGS. 4 and 12.

Referring to FIGS. 16 and 18, a bank BK may be disposed in the entire non-emission area NEA disposed between emission areas emitting light of the same color (e.g., between EA1 and EA1, between EA2 and EA2, or between EA3 and EA3).

Referring to FIGS. 16 and 18, an auxiliary layer PL may not be disposed in the non-emission area NEA disposed between emission areas emitting light of the same color (e.g., between EA1 and EA1, between EA2 and EA2, or between EA3 and EA3).

Accordingly, an undercut structure constituted of the auxiliary layer PL and the bank BK may not be disposed in the non-emission area between emission areas emitting light of the same color (e.g., between EA1 and EA1, between EA2 and EA2, or between EA3 and EA3).

Accordingly, as illustrated in FIG. 18, the first light emitting layer EL1, the second light emitting layer EL2, the third light emitting layer EL3, and the cathode electrode CE of the light emitting element may be continuously extended and disposed in the non-emission area between the emission areas emitting light of the same color (e.g., between EA1 and EA1, between EA2 and EA2, or between EA3 and EA3) as well as the emission areas emitting light of the same color.

Next, a manufacturing process of the display panel 110 according to embodiments of the disclosure is briefly described below.

Figure 19:
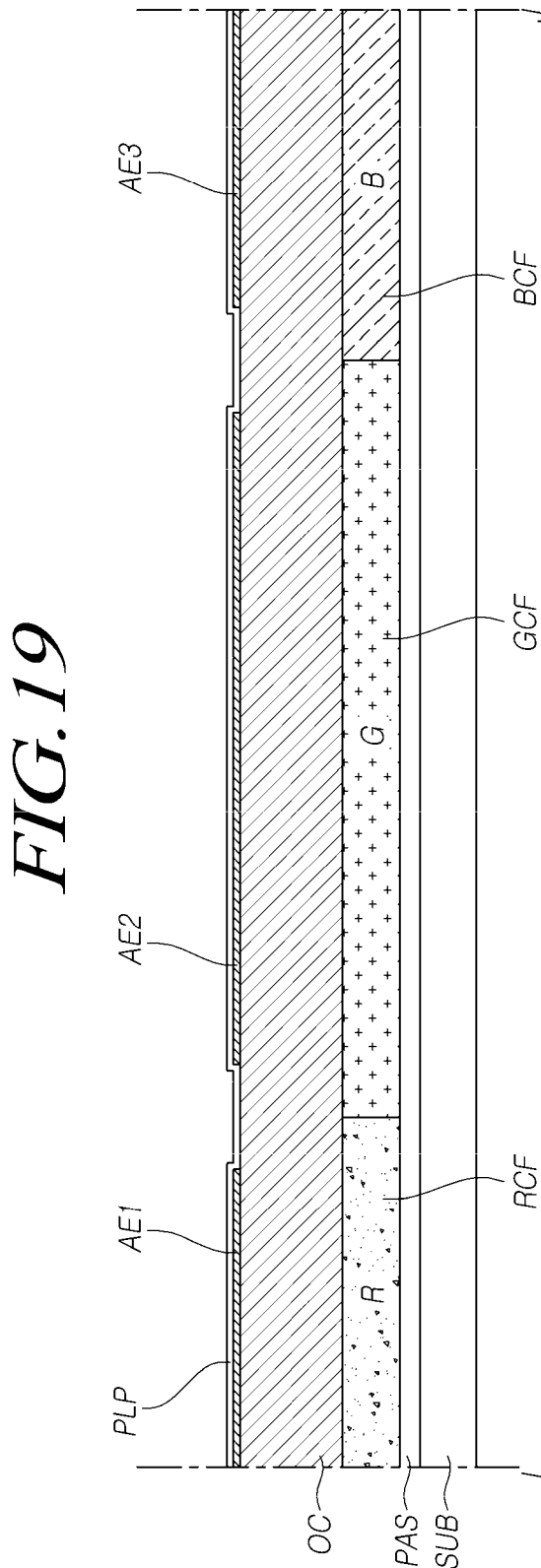
FIGS. 19, 20, and 21 are views schematically illustrating part of a manufacturing process of the display panel illustrated in FIGS. 16 to 18.
Figure 19:
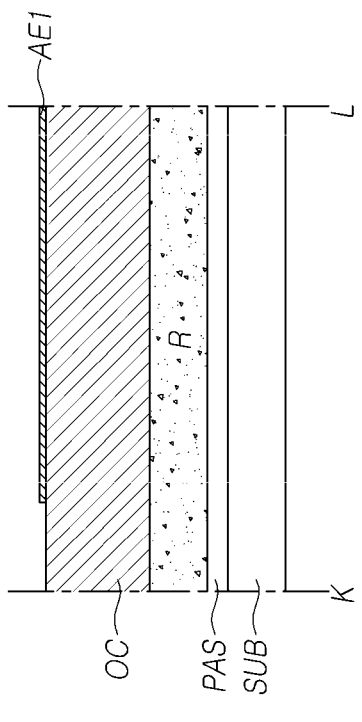
Figure 21:
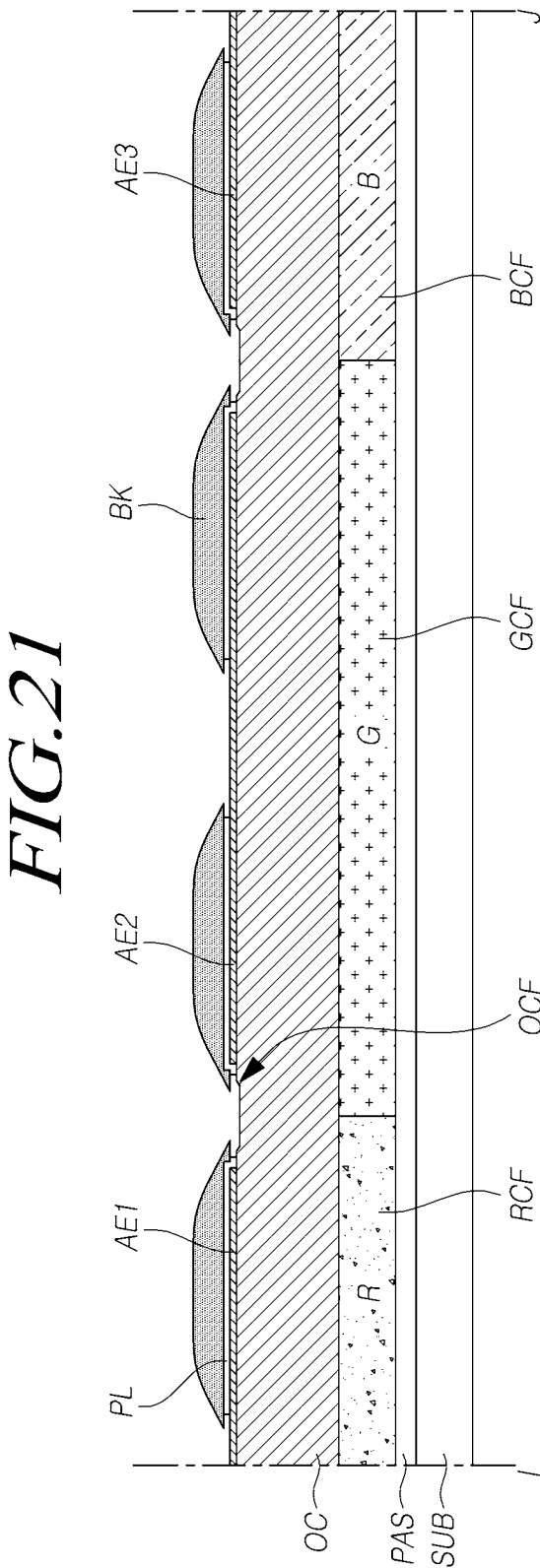
Figure 21:
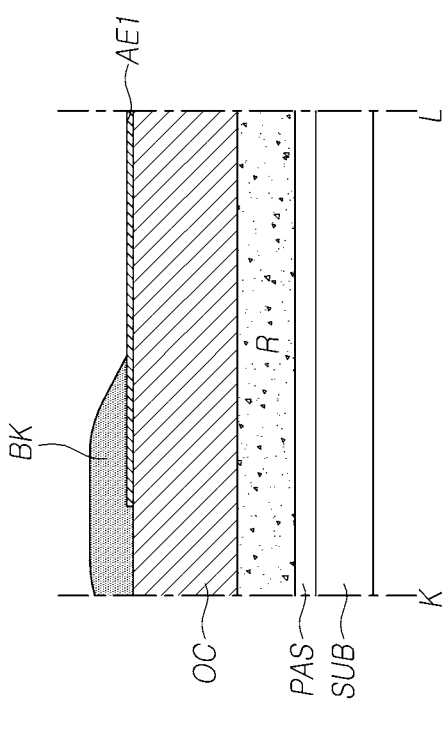

FIGS. 19, 9, and 21 are views schematically illustrating part of a manufacturing process of the display panel illustrated in FIGS. 16 to 18.

First, referring to FIG. 19, an insulation film PAS, a plurality of color filters RCF, GCF, and BCF, an overcoat layer OC, and a plurality of anode electrodes AE1, AE2, and AE3 may be disposed on the substrate SUB.

An auxiliary layer material PLP may be disposed on the substrate SUB on which the plurality of anode electrodes AE1, AE2, and AE3 are disposed.

The auxiliary layer material PLP may include an inorganic insulating material. For example, the auxiliary layer PL may include at least one of silicon oxide (SiOx), silicon nitride (SiNx), or the like, but embodiments of the disclosure are not limited thereto.

Further, embodiments of the disclosure are not limited thereto, and the auxiliary layer material PLP may include a metal material.

Referring to FIG. 19, the auxiliary layer material PLP may be etched through a first etching process using a separate mask. As illustrated in FIG. 19, since the auxiliary layer material PLP is removed between the emission areas emitting light of the same color, even if the auxiliary layer material PLP includes a metal material, the electrical connection between the anode electrodes may not arise.

Accordingly, the auxiliary layer material PLP disposed between the first anode electrode AE1 and another first anode electrode AE1, between the second anode electrode AE2 and another second anode electrode AE2, and between the third anode electrode AE3 and another third anode electrode AE3 may be removed.

Further, the auxiliary layer material PLP disposed at a portion of edges of the plurality of anode electrodes AE1, AE2, and AE3 may be removed.

Specifically, the auxiliary layer material PLP may be removed on an edge of the first anode electrode AE1 adjacent to the other first anode electrode AE1. Further, the auxiliary layer material PLP may be removed on the edge of the second anode electrode AE2 adjacent to the other second anode electrode AE2. Further, the auxiliary layer material PLP may be removed on the edge of the third anode electrode AE3 adjacent to the other third anode electrode AE3.

Figure 20:
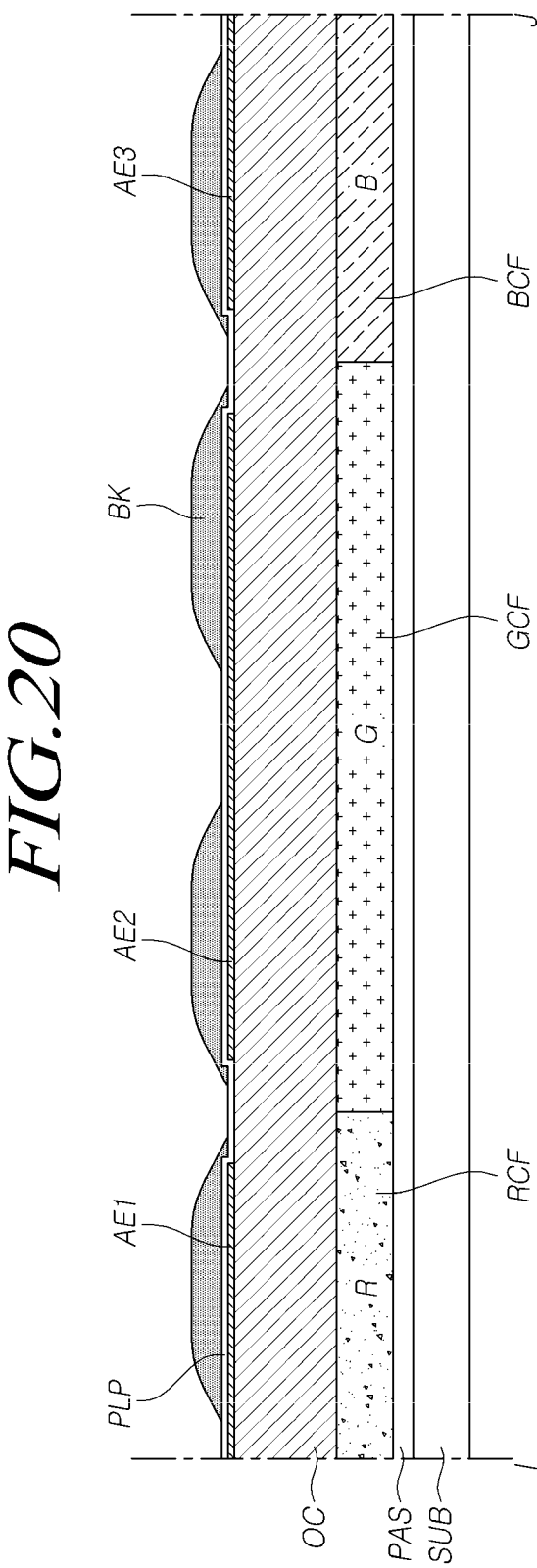
Figure 20:
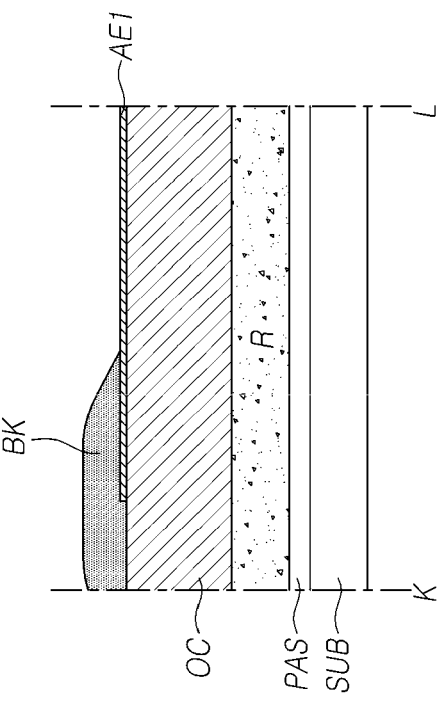

Thereafter, as illustrated in FIG. 20, the bank BK may be disposed on the substrate SUB where the auxiliary layer material PLP is partially removed.

The bank BK may be disposed to expose a portion of the upper surfaces of the plurality of anode electrodes AE1, AE2, and AE3.

Further, the bank BK may not be disposed in a partial area between the first anode electrode AE1 and the second anode electrode AE2, between the second anode electrode AE2 and the third anode electrode AE3, and between the third anode electrode AE3 and the first anode electrode AE1.

Further, referring to FIG. 20, the bank BK may be disposed in an area between the first anode electrode AE1 and another first anode electrode AE1, between the second anode electrode AE2 and another second anode electrode AE2, and between the third anode electrode AE3 and another third anode electrode AE3.

Thereafter, referring to FIG. 21, the auxiliary layer material PLP may be secondarily etched using the bank BK as a mask. The entire auxiliary layer material PLP in the area where the bank BK is not present may be etched, and the auxiliary layer material PLP overlapping the edge of the bank BK may also be etched.

Referring to FIG. 21, a portion of the overcoat layer OC may be etched in an area where the first to third anode electrodes AE1, AE2, and AE3 are not disposed on the overcoat layer OC, among areas between the first anode electrode AE1 and another first anode electrode AE1, between the second anode electrode AE2 and another second anode electrode AE2, and between the third anode electrode AE3 and another third anode electrode AE3.

Accordingly, in the area where the first to third anode electrodes AE1. AE2, and AE3 are not disposed, a recess may be formed in the overcoat layer OC. Accordingly, a stepped portion OCF of the overcoat layer OC may occur at the boundary between the area where the first to third anode electrodes AE1, AE2, and AE3 are disposed and the area where the first to third anode electrodes AE1, AE2, and AE3 are not disposed.

On the other hand, the auxiliary layer PL is not disposed between the first anode electrode AE1 and another first anode electrode AE1, between the second anode electrode AE2 and another second anode electrode AE2, and between the third anode electrode AE3 and another third anode electrode AE3, and the rear surface RS of the bank BK may contact a portion of the upper surface USS of the overcoat layer OC and a portion of the upper surface US of the first anode electrode AE1.

Accordingly, the undercut structure constituted of the bank BK and the auxiliary layer PL may not be disposed in the area between the first anode electrode AE1 and another first anode electrode AE1, between the second anode electrode AE2 and another second anode electrode AE2, and between the third anode electrode AE3 and another third anode electrode AE3.

Figure 22:
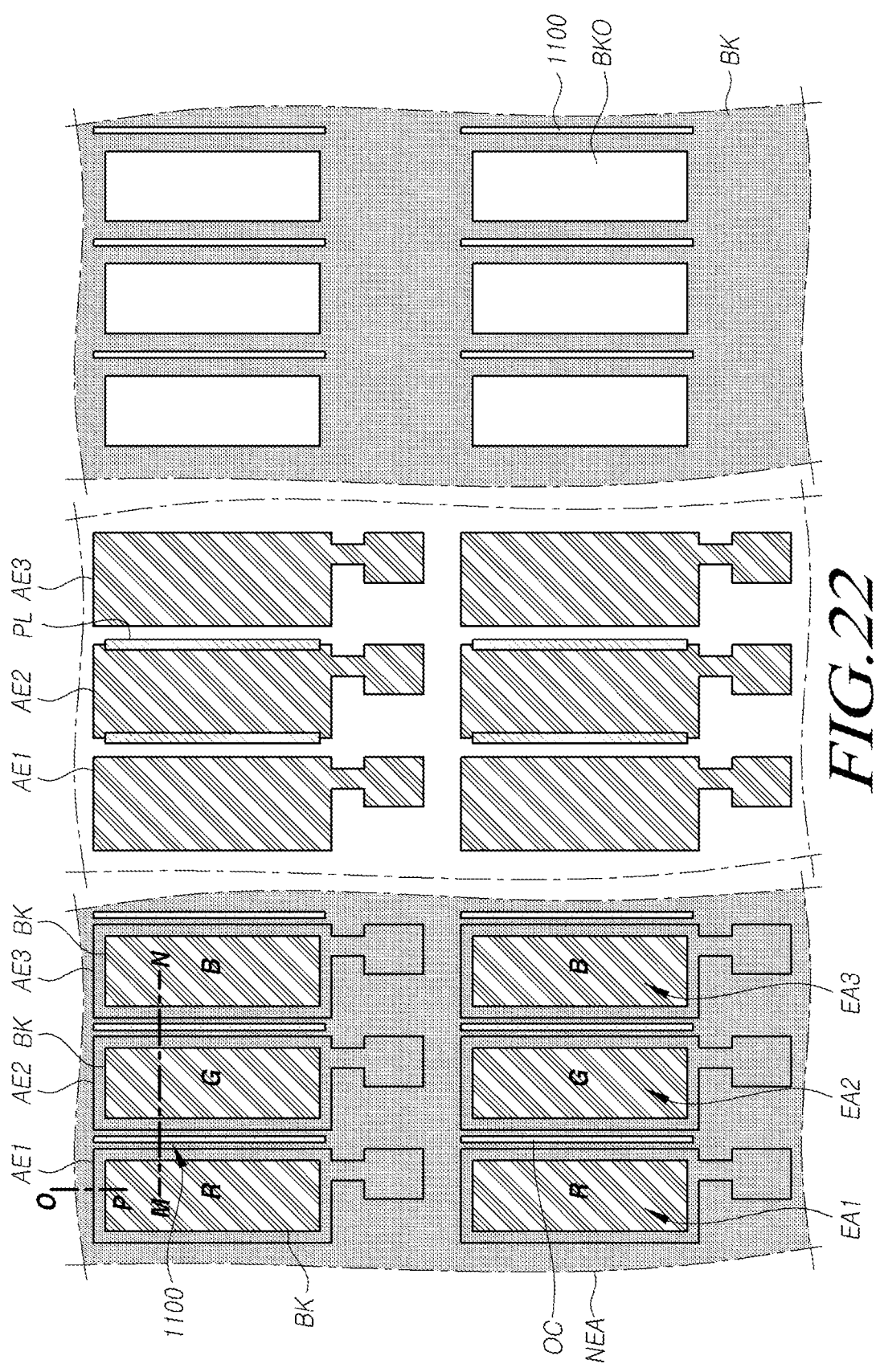
FIG. 22 is a view illustrating a planar structure of a display panel according to embodiments of the disclosure.
Figure 23:
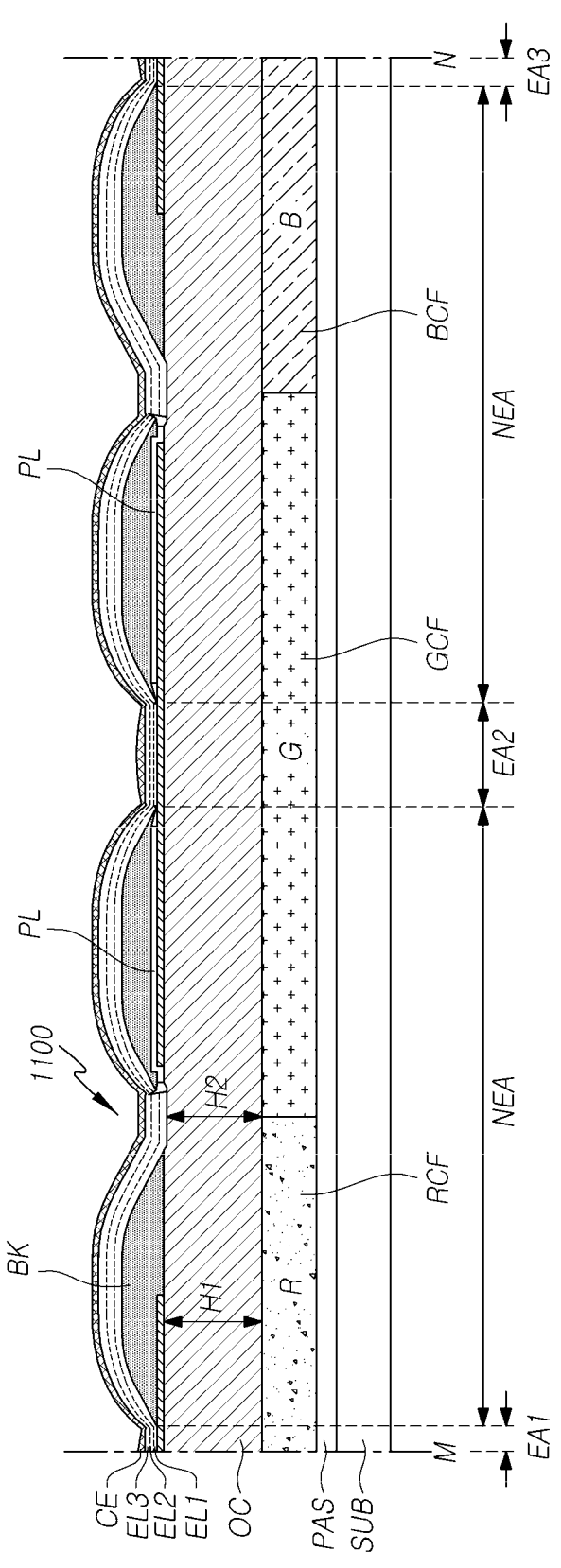
FIG. 23 is a cross-sectional view taken along M-N of FIG. 22.
Figure 24:
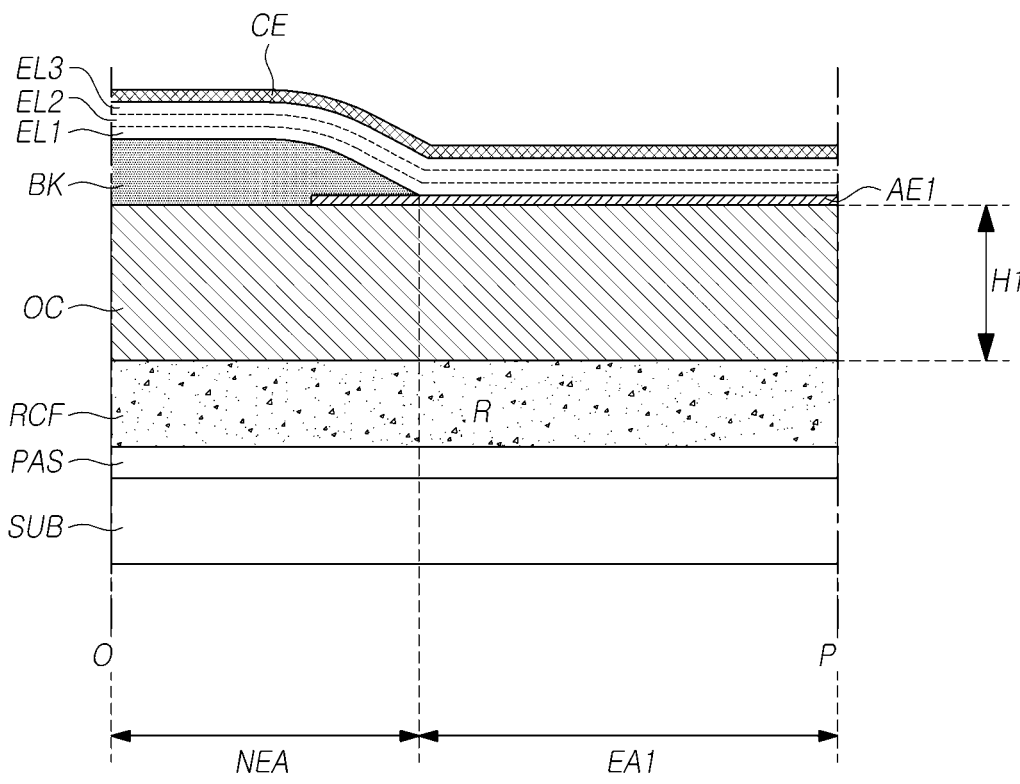
FIG. 24 is a cross-sectional view taken along line O-P of FIG. 22.

FIG. 22 is a view illustrating a planar structure of a display panel according to embodiments of the disclosure. FIG. 23 is a cross-sectional view taken along M-N of FIG. 22. FIG. 24 is a cross-sectional view taken along line O-P of FIG. 22.

Referring to FIGS. 22 and 23, the display area DA of the display panel 110 according to embodiments of the disclosure may include a plurality of emission areas EA1, EA2, and EA3 and a non-emission area NEA surrounding the plurality of emission areas EA1, EA2, and EA3.

Referring to FIGS. 22 and 23, the auxiliary layer PL may be disposed only on some of the plurality of anode electrodes AE1, AE2, and AE3.

For example, as illustrated in FIGS. 22 and 23, the auxiliary layer PL overlapping a portion of the upper surface of the second anode electrode AE2 may be disposed.

The auxiliary layer PL may be disposed between emission areas emitting light of different colors.

For example, as illustrated in FIGS. 22 and 23, the auxiliary layer PL may have a form in which a plurality of patterns are disposed on the substrate SUB, and the auxiliary layer PL may be disposed in a portion of the non-emission area NEA between the first emission area EA1 and the second emission area EA2 while overlapping a portion of the upper surface of the second anode electrode AE2.

Further, the auxiliary layer PL may be disposed in a portion of the non-emission area NEA between the second emission area EA2 and the third emission area EA3 adjacent to the second emission area EA2 while overlapping a portion of the upper surface of the second anode electrode AE2.

The position of the auxiliary layer PL is merely an example, and the auxiliary layer PL may extend to a portion of the non-emission area NEA between the first emission area EA1 and the second emission area EA2 adjacent to the first emission area EA1 while overlapping a portion of the upper surface of the first anode electrode AE1, and the auxiliary layer PL may extend to a portion of the non-emission area NEA between the first emission area EA1 and the third emission area EA3 adjacent to the first emission area EA1 while overlapping a portion of the upper surface of the first anode electrode AE1.

Further, referring to FIG. 22, the auxiliary layer PL may not be disposed at an edge of each of the first to third anode electrodes AE1, AE2, and AE3 in an area between emission areas emitting light of the same color, and may not be disposed on the overcoat layer OC.

Referring to FIGS. 22 and 23, a bank BK exposing a portion of an upper surface of each of the plurality of anode electrodes AE1, AE2, and AE3 may be disposed on the plurality of anode electrodes AE1. AE2, and AE3. As illustrated in FIG. 22, the upper surface of each of the plurality of anode electrodes AE1, AE2, and AE3 may overlap an opening BKO provided in the bank BK.

Referring to FIGS. 22 and 23, the bank BK may include at least one hole 1100 exposing a portion of the upper surface of the overcoat layer OC between the emission areas EA1. EA2, and EA3 emitting light of different colors and the emission areas EA1, EA2, and EA3 emitting light of different colors.

Meanwhile, referring to FIGS. 22 and 23, an uncut structure may be disposed in a partial area between emission areas emitting light of different colors in the display panel 110 according to embodiments of the disclosure.

Specifically, referring to FIG. 23, the auxiliary layer PL may be disposed to surround a portion of the upper surface and the side surface of the second anode electrode AE2.

A bank BK may be disposed on the auxiliary layer PL.

Further, as illustrated in FIG. 23, the bank BK may be disposed to surround a portion of the upper surface and a side surface of the first anode electrode AE1 and the third anode electrode AE3 on which the auxiliary layer PL is not disposed.

The bank BK may be disposed to expose a portion of the upper surface of the overcoat layer OC by including the hole 1100 in the area where the first to third anode electrodes AE1. AE2, and AE3 and the auxiliary layer PL are not disposed.

The bank BK may form an undercut structure together with the auxiliary layer PL disposed in a portion of the non-emission area NEA.

Specifically, the bank BK may have a structure of protruding in a direction perpendicular to the direction in which the second anode electrode AE2 is stacked on the overcoat layer OC beyond where a side surface of the auxiliary layer PL is disposed, so that it may include an area where an edge of the bank BK does not overlap the second anode electrode AE2 and the auxiliary layer PL but overlaps the overcoat layer OC.

Referring to FIG. 23, the area where the bank BK does not overlap the second anode electrode AE2 and the auxiliary layer PL but overlaps the overcoat layer OC from one end of the auxiliary layer PL not overlapping the second anode electrode AE2 may be the area where the undercut structure is formed.

Accordingly, the overcoat layer OC may have a different height in each area.

For example, referring to FIG. 23, the overcoat layer OC may have a first height H1 in the area where the first to third anode electrodes AE1, AE2, and AE3 are disposed and the area where the auxiliary layer PL is disposed. The overcoat layer OC may have the first height H1 in the area where an upper surface of the overcoat layer OC and a rear surface of the bank BK contact each other.

Referring to FIG. 23, the overcoat layer OC may include at least one stepped portion OCF in an area overlapping an edge of the bank BK that does not overlap the second anode electrode AE2 and the auxiliary layer PL.

The overcoat layer OC may include a stepped portion OCF in the area where the bank BK does not overlap the first to third anode electrodes AE1, AE2, and AE3 and the auxiliary layer PL, but the upper surface of the overcoat layer OC and the rear surface of the bank BK are spaced apart from each other.

Accordingly, the overcoat layer OC may have a second height H2 lower than the first height H1 in the area corresponding to the hole 1100 of the bank BK provided between the emission areas emitting light of different colors.

As described above, the undercut structure disposed in the non-emission area between the emission areas emitting light of different colors may be constituted of the bank BK, the auxiliary layer PL, and the stepped portion OCF of the overcoat layer OC.

A plurality of organic layers CGL1, EL, and CGL2 and the cathode electrode CE included in the light emitting element ED may be disposed on the bank BK.

Referring to FIG. 23, in the first light emitting layer EL1, the overcoat layer OC may be broken at a portion corresponding to the stepped portion OCF due to the undercut structure generated by the bank BK and the auxiliary layer PL.

In other words, an undercut structure may be provided in a portion of the non-emission area NEA due to the auxiliary layer PL and the bank BK disposed on the second anode electrode AE2, thereby preventing unnecessary light emission in the non-emission area NEA around the second emission area EA2.

In particular, it is possible to prevent light emission in the non-emission area NEA between the first emission area EA1 and the second emission area EA2 and the non-emission area NEA between the second emission area EA2 and the third emission area EA3.

Referring to FIGS. 22 and 24, a bank BK may be disposed in the entire non-emission area NEA disposed between emission areas emitting light of the same color (e.g., between EA1 and EA1, between EA2 and EA2, or between EA3 and EA3).

Referring to FIGS. 22 and 24, an auxiliary layer PL may not be disposed in the non-emission area NEA disposed between emission areas emitting light of the same color (e.g., between EA1 and EA1, between EA2 and EA2, or between EA3 and EA3).

Accordingly, an undercut structure constituted of the auxiliary layer PL and the bank BK may not be disposed in the non-emission area between emission areas emitting light of the same color (e.g., between EA1 and EA1, between EA2 and EA2, or between EA3 and EA3).

Referring to FIG. 24, a stepped portion of the overcoat layer OC is not formed in the area where the first anode electrode AE1 is disposed and the area where the rear surface of the bank BK and the upper surface of the overcoat layer OC contact each other, and thus the overcoat layer OC may have the first height H1.

As illustrated in FIG. 24, the first light emitting layer EL1, the second light emitting layer EL2, the third light emitting layer EL3, and the cathode electrode CE of the light emitting element may be continuously extended and disposed in the non-emission area between the emission areas emitting light of the same color (e.g., between EA1 and EA1, between EA2 and EA2, or between EA3 and EA3) as well as the emission areas emitting light of the same color.

Next, a manufacturing process of the display panel 110 according to embodiments of the disclosure is briefly described below.

Figure 25:
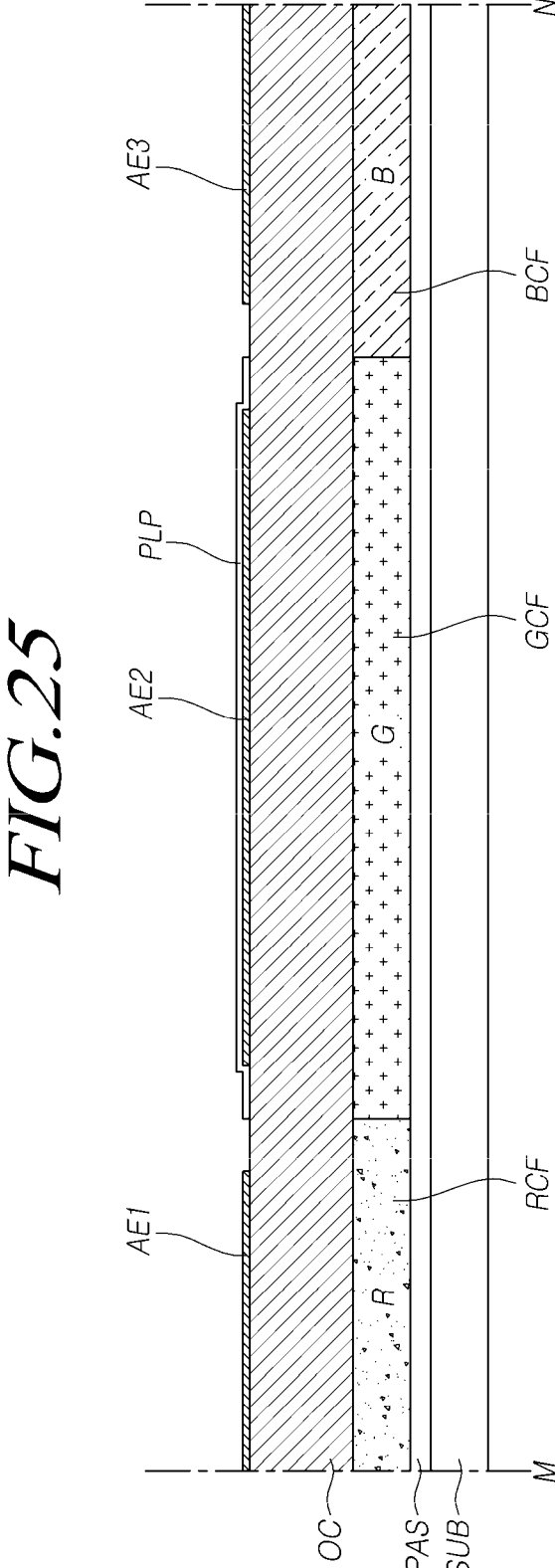
FIGS. 25, 26, and 27 are views schematically illustrating part of a manufacturing process of the display panel illustrated in FIGS. 22 to 24.
Figure 25:
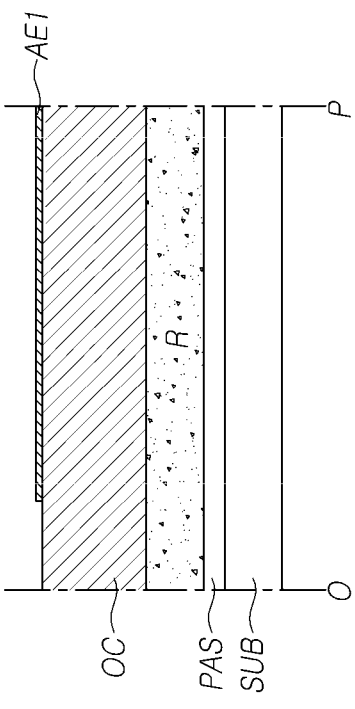
Figure 26:
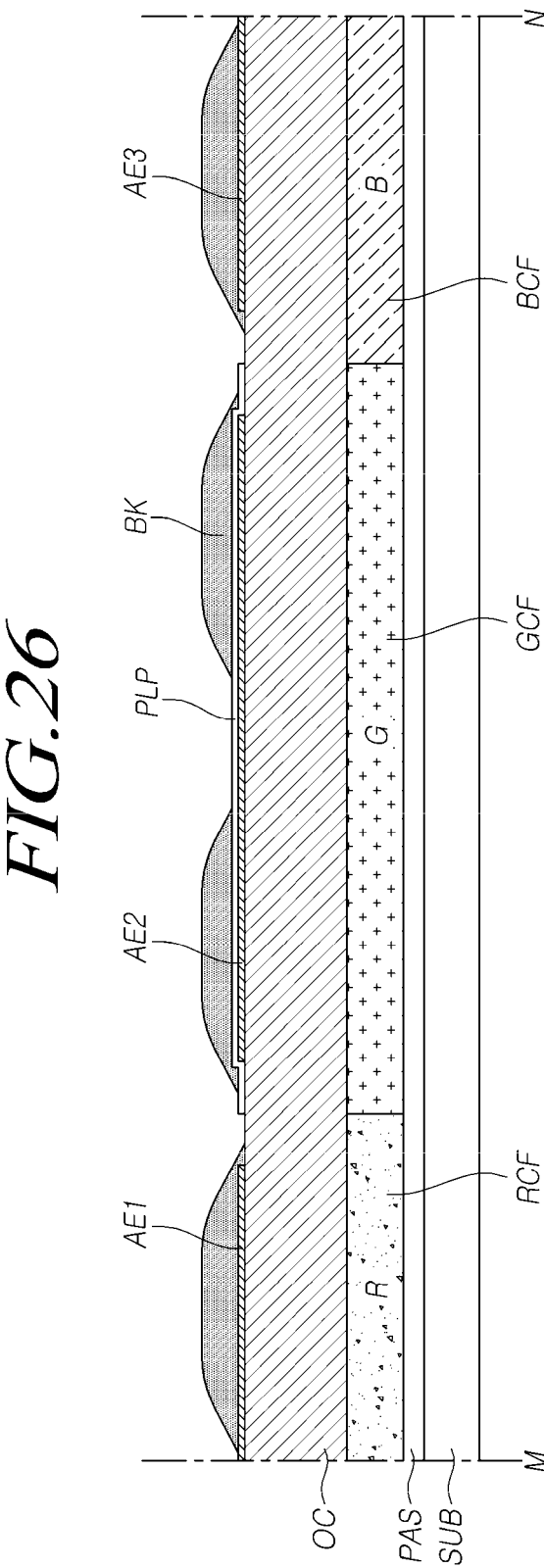
Figure 26:
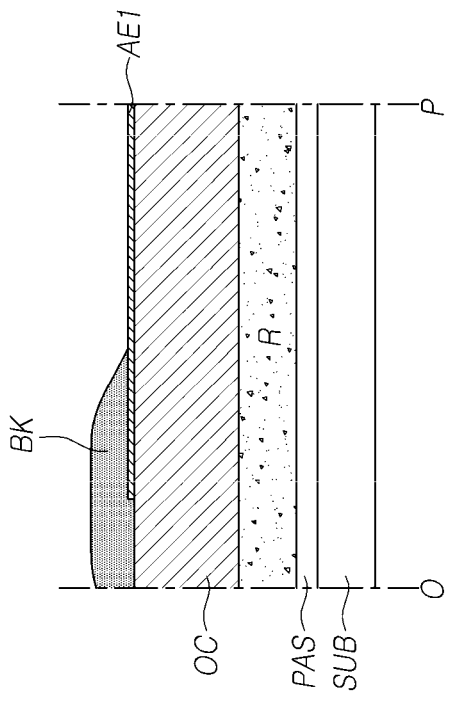
Figure 27:
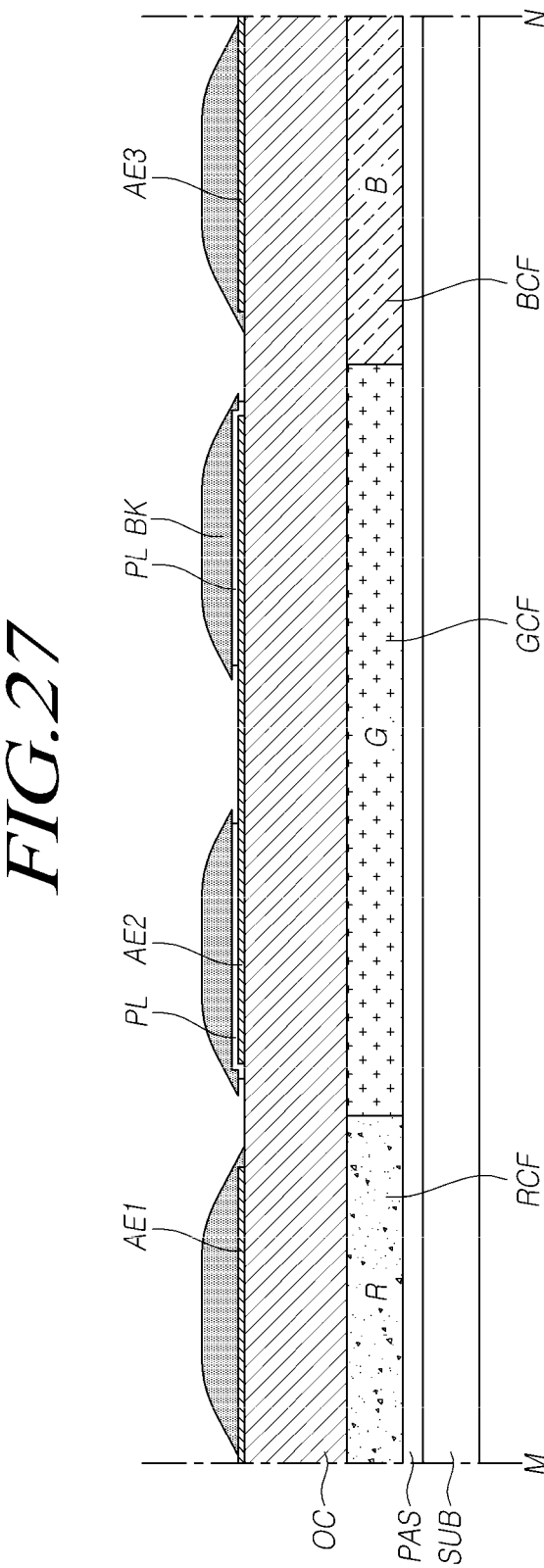
Figure 27:
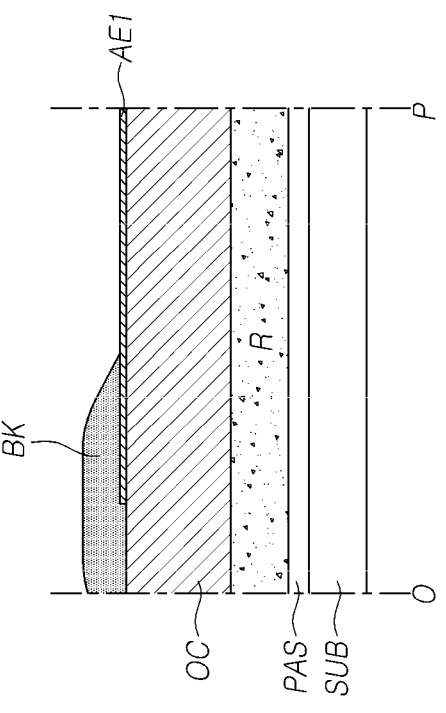

FIGS. 25, 26, and 27 are views schematically illustrating part of a manufacturing process of the display panel illustrated in FIGS. 22 to 24.

First, referring to FIG. 25, an insulation film PAS, a plurality of color filters RCF, GCF, and BCF, an overcoat layer OC, and a plurality of anode electrodes AE1, AE2, and AE3 may be disposed on the substrate SUB.

An auxiliary layer material PLP may be disposed on the substrate SUB on which the plurality of anode electrodes AE1, AE2, and AE3 are disposed.

The auxiliary layer material PLP may include an inorganic insulating material. For example, the auxiliary layer PL may include silicon oxide (SiOx), silicon nitride (SiNx), or the like, but embodiments of the disclosure are not limited thereto.

Further, embodiments of the disclosure are not limited thereto, and the auxiliary layer material PLP may include a metal material.

Referring to FIG. 25, the auxiliary layer material PLP may be etched through a first etching process using a separate mask.

For example, the auxiliary layer material PLP may be etched to surround the upper surface and the side surface of the second anode electrode AE2 and to be disposed only up to a portion of the upper surface of the overcoat layer OC.

Thereafter, as illustrated in FIG. 26, the bank BK may be disposed on the substrate SUB where the auxiliary layer material PLP is partially removed.

The bank BK may be disposed to expose a portion of the upper surfaces of the plurality of anode electrodes AE1, AE2, and AE3.

Further, the bank BK may not be disposed in a partial area between the first anode electrode AE1 and the second anode electrode AE2, between the second anode electrode AE2 and the third anode electrode AE3, and between the third anode electrode AE3 and the first anode electrode AE1.

Further, referring to FIG. 26, the bank BK may overlap a portion of the auxiliary layer material PLP disposed on the second anode electrode AE2 while overlapping an edge of the second anode electrode AE2.

Thereafter, referring to FIG. 27, the auxiliary layer material PLP may be secondarily etched using the bank BK as a mask.

The entire auxiliary layer material PLP in the area where the bank BK is not present may be etched, and the auxiliary layer material PLP overlapping the edge of the bank BK may also be etched.

Accordingly, as illustrated in FIG. 27, the auxiliary layer PL may be disposed from a portion of the upper surface of the second anode electrode AE2 to a portion of the upper surface of the overcoat layer OC in which the anode electrodes AE1, AE2, and AE3 are not disposed.

The entire auxiliary layer PL formed as described above may overlap a portion of the bank BK.

In the process of secondary etching the auxiliary layer PL, a recess including the stepped portion OCF may be formed in a partial area of the overcoat layer OC.

The stepped portion OCF of the overcoat layer OC may be provided in the area where the bank BK does not overlap the second anode electrode AE2 and the auxiliary layer PL, but the upper surface of the overcoat layer OC and the rear surface of the bank BK are spaced apart from each other by the auxiliary layer PL.

Accordingly, the undercut structure including the bank BK, the auxiliary layer PL, and the stepped portion OCF of the overcoat layer OC may be provided between the first anode electrode AE1 and the second anode electrode AE2.

According to embodiments of the disclosure, there may be provided a display panel and a display device capable of preventing a change in color coordinates due to emission of light from an adjacent subpixel at a low gray level by disposing an undercut structure in a partial area of the non-emission area between emission areas which emit different colors of light to thereby break the organic layer of the light emitting element in the non-emission area.

According to embodiments of the disclosure, there may be provided a display panel and a display device capable of low-power driving by preventing leakage of light from a non-emission area.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed:

1. A display panel, comprising:

a substrate;

an overcoat layer on the substrate;

a first anode electrode, a second anode electrode, and a third anode electrode on the overcoat layer and spaced apart from each other;

an auxiliary layer on a portion of an upper surface and a portion of a side surface of at least one of the first to third anode electrodes and extending to a portion of an upper surface of the overcoat layer;

a bank disposed on the auxiliary layer and the first to third anode electrodes and including an opening exposing a portion of an upper surface of each of the first to third anode electrodes;

a multi-layered organic layer disposed on the bank; and a cathode electrode disposed on the multi-layered organic layer, wherein the overcoat layer includes a stepped portion in an area where the bank does not overlap at least one of the first to third anode electrodes and the auxiliary layer, and wherein the upper surface of the overcoat layer and a rear surface of the bank are spaced apart from each other at the stepped portion.

2. The display panel of claim 1, wherein the substrate includes a first emission area overlapping a portion of the first anode electrode, a second emission area overlapping a portion of the second anode electrode, and a third emission area overlapping a portion of the third anode electrode, wherein the first to third emission areas emit light of different colors, wherein the first to third emission areas are surrounded by a non-emission area, wherein the bank includes at least one hole overlapping at least one of an area between the first emission area and the second emission area, an area between the second emission area and the third emission area, and an area between the third emission area and the first emission area, and wherein the hole is disposed in the non-emission area.

3. The display panel of claim 2, wherein the hole of the bank does not overlap the auxiliary layer, wherein the overcoat layer includes a recess overlapping the hole, and wherein a side surface of the recess of the overcoat layer is the stepped portion.

4. The display panel of claim 3, wherein at least one first undercut structure is disposed in an area that does not overlap the first to third anode electrodes, and wherein the first undercut structure is constituted of the auxiliary layer, an area where the bank protrudes in one direction beyond where a side surface of the auxiliary layer contacting the upper surface of the overcoat layer is disposed, and the stepped portion of the overcoat layer.

5. The display panel of claim 4, wherein a height of the first undercut structure is a sum of a height of the auxiliary layer and a height of the stepped portion of the overcoat layer.

6. The display panel of claim 4, wherein the first undercut structure is disposed in at least one of an area between the first emission area and the second emission area, an area between the second emission area and the third emission area, and an area between the third emission area and the first emission area.

7. The display panel of claim 4, wherein the multi-layered organic layer includes a first charge generation layer disposed on the bank, a light emitting layer disposed on the first charge generation layer, and a second charge generation layer disposed on the light emitting layer, wherein a thickness of the first charge generation layer is smaller than a thickness of the light emitting layer and a thickness of the second charge generation layer, and wherein the first charge generation layer has a broken area in an area corresponding to the first undercut structure.

8. The display panel of claim 1, wherein the substrate includes a first emission area overlapping a portion of the first anode electrode, a second emission area overlapping a portion of the second anode electrode, and a third emission area overlapping a portion of the third anode electrode, wherein the first to third emission areas emit light of different colors, and wherein the stepped portion is disposed in a non-emission area between two emission areas emitting light of the same color.

9. The display panel of claim 8, wherein the bank is not:

disposed in a portion of a non-emission area between the first emission area and another adjacent first emission area;

disposed in a portion of a non-emission area between the second emission area and another adjacent second emission area; and disposed in a portion of a non-emission area between the third emission area and another adjacent third emission area.

10. The display panel of claim 9, wherein the overcoat layer includes at least one recess overlapping in an area where the bank is not disposed among the non-emission areas between the emission areas emitting the light of the same color, and wherein a side surface of the recess is the stepped portion.

11. The display panel of claim 10, wherein at least one first undercut structure is disposed in the non-emission area between the emission areas emitting the light of the same color.

12. The display panel of claim 1, wherein the substrate includes a first emission area overlapping a portion of the first anode electrode, a second emission area overlapping a portion of the second anode electrode, and a third emission area overlapping a portion of the third anode electrode, wherein the first to third emission areas emit light of different colors, and wherein the bank is disposed in a non-emission area between emission areas emitting light of the same color.

13. The display panel of claim 12, wherein the auxiliary layer is disposed under the bank in the non-emission area, and wherein the stepped portion of the overcoat layer is not disposed under the auxiliary layer.

14. The display panel of claim 12, wherein the auxiliary layer is not disposed under the bank in the non-emission area, and wherein a portion of a rear surface of the bank contacts the portion of the upper surface of the overcoat layer in an area not overlapping the first to third anode electrodes.

15. The display panel of claim 11, wherein a second undercut structure is disposed on at least one of the first to third anode electrodes.

16. The display panel of claim 15, wherein the second undercut structure is constituted of the auxiliary layer disposed on an upper surface of at least one of the first to third anode electrodes and an area where the bank protrudes in one direction beyond where a side surface of the auxiliary layer is disposed.

17. The display panel of claim 15, wherein a height of the second undercut structure is the same as a height of the auxiliary layer.

18. The display panel of claim 17, wherein a height of the first undercut structure is larger than a height of the second undercut structure.

19. The display panel of claim 15, wherein the multi-layered organic layer extends along an upper surface of the first to third anode electrodes and the bank in an area overlapping the second undercut structure.

20. The display panel of claim 15, wherein the auxiliary layer includes at least one of silicon oxide (SiOx) and silicon nitride (SiNx).

21. The display panel of claim 1, wherein a portion of an upper surface of at least one of the first to third anode electrodes contacts a rear surface of the bank, and wherein the auxiliary layer includes at least one of silicon oxide (SiOx), silicon nitride (SiNx), and a metal.

22. The display panel of claim 1, wherein in a partial area of an area not overlapping the first to third anode electrodes is disposed a first undercut structure constituted of the auxiliary layer, an area where the bank protrudes in one direction beyond where a side surface of the auxiliary layer contacting the upper surface of the overcoat layer is disposed, and the stepped portion of the overcoat layer, and wherein in an area overlapping an upper surface of at least one of the first to third anode electrodes is disposed a second undercut structure constituted of the auxiliary layer and an area where the bank protrudes in one direction beyond where a side surface of the auxiliary layer is disposed.

23. A display device, comprising:
a substrate;

an overcoat layer disposed on the substrate;

a first anode electrode, a second anode electrode, and a third anode electrode disposed on the overcoat layer and spaced apart from each other;

an auxiliary layer disposed on a portion of an upper surface and a portion of a side surface of at least one of the first to third anode electrodes and extending to a portion of an upper surface of the overcoat layer;

a bank disposed on the auxiliary layer and the first to third anode electrodes and including an opening exposing a portion of an upper surface of each of the first to third anode electrodes;

a multi-layered organic layer disposed on the bank; and a cathode electrode disposed on the multi-layered organic layer, wherein in a partial area of an area not overlapping the first to third anode electrodes is disposed an undercut structure constituted of the auxiliary layer, an area where the bank protrudes in one direction beyond where a side surface of the auxiliary layer contacting the upper surface of the overcoat layer is disposed, and the stepped portion of the overcoat layer, and wherein at least one layer of the multi-layered organic layer is broken in an area overlapping the undercut structure.

24. A display device, comprising:

a substrate;

an overcoat layer on the substrate, the overcoat layer having a first surface and a second surface opposite the first surface, the second surface is closer to the substrate than the first surface;

a groove at the first surface of the overcoat layer;

a first anode electrode and a second anode electrode on an area that is not the first area of the overcoat layer, the first and second anode electrode spaced apart from each other by the groove;

a first bank on the first anode electrode;

a second bank on the second anode electrode, the second bank and the first bank spaced apart from each other by the groove;

at least one organic layer on the first and second anode electrodes and the first and second banks; and a cathode electrode on the at least one organic layer, wherein at least one layer of the at least one organic layer is disconnected at a location adjacent to the groove of the overcoat layer, wherein the overcoat layer has a first thickness at a first area where the groove is located and a second thickness at a second area where the groove is not located, the second thickness being greater than the first thickness, wherein the first thickness at the first area is positioned between the second surface and the first surface, wherein the second thickness at the second area is positioned between the second surface and a third surface, the third surface being between the first surface and the second surface.

25. The display device of claim 24, wherein the at least one organic layer includes a first light emitting layer, a second light emitting layer, and a third light emitting layer, wherein the second light emitting layer is between the first light emitting layer and the third light emitting layer, wherein the third light emitting layer is between the second light emitting layer and the cathode electrode, and wherein the first light emitting layer is disconnected at the location adjacent to the groove of the overcoat layer.

26. The display device of claim 25, wherein the second light emitting layer is disconnected at the location adjacent to the groove of the overcoat layer.

27. The display device of claim 26, wherein the third light emitting layer is continuously and contiguously disposed at a location where the first and second light emitting layers are disconnected.

28. The display device of claim 25, wherein the cathode electrode is continuously and contiguously disposed at a location where the first light emitting layer is disconnected.

29. The display device of claim 24, comprising:

a first auxiliary layer between the first anode electrode and the first bank;

a second auxiliary layer between the second anode electrode and the second bank;

wherein the first and second auxiliary layers are spaced apart from each other.

30. The display device of claim 29, wherein the first anode electrode has an upper surface and a side surface extending from the upper surface, wherein the first auxiliary layer contacts the upper surface and side surface of the first anode electrode, wherein the first auxiliary layer does not overlap with the groove from a plan view.

31. The display device of claim 29, wherein a width of the first auxiliary layer in a first direction is smaller than a width of the first bank in the first direction.

32. The display device of claim 24, comprising a color filter layer between the overcoat layer and the substrate, wherein the color filter layer includes a first color filter of a first color and a second color filter of a second color different from the first color, wherein a location where the first color filter and the second color filter abuts overlaps with the groove of the overcoat layer from a plan view.

33. The display device of claim 32, wherein the first color filter of the color filter layer fully overlaps with the first bank from a plan view.

34. The display device of claim 29, wherein the first auxiliary layer has a first end and the second auxiliary layer has a second end and a third end opposite the second end, wherein the first end of the first auxiliary layer faces the second end of the second auxiliary layer, wherein the at least one organic layer includes a first light emitting layer, a second light emitting layer, and a third light emitting layer, wherein the second light emitting layer is between the first light emitting layer and the third light emitting layer, wherein the third light emitting layer is between the second light emitting layer and the cathode electrode, and wherein the first light emitting layer is disconnected at the location adjacent to the second end of the second auxiliary layer.

35. The display device of claim 29, wherein the first auxiliary layer has a first end and the second auxiliary layer has a second end and a third end opposite the second end, wherein the first end of the first auxiliary layer faces the second end of the second auxiliary layer, wherein the at least one organic layer includes a first light emitting layer, a second light emitting layer, and a third light emitting layer, wherein the second light emitting layer is between the first light emitting layer and the third light emitting layer, wherein the third light emitting layer is between the second light emitting layer and the cathode electrode, and wherein the first light emitting layer is not disconnected at the location adjacent to the third end of the second auxiliary layer.

\* \* \* \* \*